(12) United States Patent
Lee et al.

(10) Patent No.: US 11,114,500 B2
(45) Date of Patent: Sep. 7, 2021

(54) DISPLAY DEVICE AND METHOD OF MANUFACTURING THE SAME

(71) Applicant: Samsung Display Co., Ltd., Yongin-si (KR)

(72) Inventors: Won Jun Lee, Hwaseong-si (KR); Hyo Chul Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/560,359

(22) Filed: Sep. 4, 2019

(65) Prior Publication Data
US 2020/0075667 A1    Mar. 5, 2020

(30) Foreign Application Priority Data
Sep. 5, 2018 (KR) .................. 10-2018-0106009

(51) Int. Cl.
| | |
|---|---|
| *H01L 27/15* | (2006.01) |
| *H01L 33/36* | (2010.01) |
| *H01L 27/12* | (2006.01) |
| *H01L 25/16* | (2006.01) |
| *G09G 3/32* | (2016.01) |
| *H01L 33/62* | (2010.01) |
| *H01L 33/44* | (2010.01) |

(52) U.S. Cl.
CPC .......... *H01L 27/156* (2013.01); *H01L 27/124* (2013.01); *H01L 33/36* (2013.01); *H01L 33/44* (2013.01); *H01L 33/62* (2013.01); *G09G 3/32* (2013.01); *G09G 2300/0426* (2013.01); *G09G 2310/027* (2013.01); *G09G 2310/0267* (2013.01)

(58) Field of Classification Search
CPC . H01L 27/156; H01L 27/124; H01L 27/1255; H01L 33/36; H01L 33/62; H01L 33/44; H01L 33/20; H01L 25/0753; G09G 2310/0267; G09G 2310/027; G09G 2320/0204; G09G 2300/0439; G08G 3/32
See application file for complete search history.

(56) References Cited

U.S. PATENT DOCUMENTS

| | | | |
|---|---|---|---|
| 9,305,496 B2 | 4/2016 | Kimura | |
| 2002/0191138 A1* | 12/2002 | Matsumoto | ....... G02F 1/134363 349/141 |
| 2008/0068305 A1* | 3/2008 | Tada | .................. G09G 3/30 345/77 |
| 2014/0367633 A1* | 12/2014 | Bibl | ................. H01L 27/322 257/13 |

* cited by examiner

*Primary Examiner* — Caridad Everhart
(74) *Attorney, Agent, or Firm* — Lewis Roca Rothgerber Christie LLP

(57) ABSTRACT

A display device includes a substrate including a display area having a plurality of pixel areas and a non-display area located around the display area; a circuit element layer including a circuit element in each of the pixel areas and a reference voltage wiring in the non-display area, the reference voltage wiring being electrically coupled to the circuit element; and a display element layer including a first pixel electrode on the circuit element layer in each of the pixel areas, a second pixel electrode located opposite to the first pixel electrode, a plurality of light emitting elements between the first pixel electrode and the second pixel electrode, and a first wiring on the circuit element layer in the non-display area, wherein the first wiring is directly coupled to the reference voltage wiring in the non-display area.

18 Claims, 26 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2018-0106009, filed on Sep. 5, 2018, in the Korean Intellectual Property Office, the entire content of which is incorporated herein by reference.

BACKGROUND

1. Field

Embodiments of the present disclosure relate to a display device including light emitting diodes and a method of manufacturing the display device.

2. Description of the Related Art

A display device displays a high-quality image using light emitting elements such as, for example light emitting diodes as light sources of pixels. A light emitting diode exhibits relatively good durability even under harsh environmental conditions and shows excellent performance in terms of lifetime and luminance.

Recently, research has been conducted to manufacture ultra-small light emitting diodes using a material having a highly reliable inorganic crystal structure and to place these light emitting diodes in a display panel to use them as next-generation pixel light sources. As part of this research, a light emitting display device using ultra-small light emitting diodes, which are as small as microscale or nanoscale, as a light source of each pixel is being developed.

SUMMARY

Aspects of embodiments of the present disclosure provide a display device that can easily align light emitting elements and increase manufacturing efficiency and a method of manufacturing the display device.

However, aspects of embodiments of the present disclosure are not restricted to the ones set forth herein. The above and other aspects of embodiments of the present disclosure will become more apparent to one of ordinary skill in the art to which the present disclosure pertains by referencing the detailed description of the present disclosure set forth herein below.

According to an aspect of an embodiment of the present disclosure, there is provided a display device.

A display device includes a substrate including a display area having a plurality of pixel areas and a non-display area located around the display area; a circuit element layer including a circuit element in each of the pixel areas and a reference voltage wiring in the non-display area, the reference voltage wiring being electrically coupled to the circuit element; and a display element layer including a first pixel electrode on the circuit element layer in each of the pixel areas, a second pixel electrode located opposite to the first pixel electrode, a plurality of light emitting elements between the first pixel electrode and the second pixel electrode, and a first wiring on the circuit element layer in the non-display area, wherein the first wiring is directly coupled to the reference voltage wiring in the non-display area.

The display element layer may be on the circuit element layer in the non-display area and may further include a second wiring coupled to the second pixel electrode.

The reference voltage wiring may include: a main wiring that extends in a first direction in the non-display area; and sub-wirings that extend in a second direction intersecting the first direction, that traverse the display area, and that are spaced apart from each other along the first direction, wherein the main wiring is directly coupled to the first wiring.

The first wiring may be adjacent to a first side of the display area, the second wiring may be adjacent to a second side opposite to the first side of the display area, and the reference voltage wiring may be adjacent to the first side of the display area.

The first wiring may overlap the reference voltage wiring.

The first wiring may include: a body portion that extends in a first direction; and a protruding portion that protrudes from the body portion in a second direction intersecting the first direction.

The protruding portion may overlap the reference voltage wiring, and the first wiring may be coupled to the reference voltage wiring by the protruding portion.

The first pixel electrode may be located on an extension line of the protruding portion.

The first pixel electrode and the first wiring may be formed by diving (e.g., separating from) one common wiring.

The circuit element layer may further include a first insulating layer, a second insulating layer, a third insulating layer, and a fourth insulating layer stacked sequentially between the substrate and the display element layer.

The reference voltage wiring may include at least one selected from a first sub-wiring between the third insulating layer and the fourth insulating layer, a second sub-wiring between the second insulating layer and the third insulating layer, a third sub-wiring between the first insulating layer and the second insulating layer, and a fourth sub-wiring between the substrate and the first insulating layer.

The first wiring may include: a first sub-wiring on the circuit element layer and directly coupled to the reference voltage wiring; and a second sub-wiring on the first sub-wiring, wherein the conductivity of the second sub-wiring is greater than that of the first sub-wiring.

The circuit element may include a transistor.

The transistor may include: a semiconductor pattern between the substrate and a first insulating layer; a gate electrode between the first insulating layer and a second insulating layer, the gate electrode overlapping the semiconductor pattern; and a first electrode between a third insulating layer and a fourth insulting layer, the first electrode being electrically coupled to the semiconductor pattern.

The first electrode of the transistor may be coupled to the first pixel electrode, and a second electrode of the transistor may be electrically coupled to the reference voltage wiring.

The first pixel electrode may be on the same layer as the second pixel electrode and spaced apart from the second pixel electrode, a first end of each of the light emitting elements is electrically coupled to the first pixel electrode, and a second end of each of the light emitting elements is electrically coupled to the second pixel electrode.

The display element layer may further include: first contact electrodes on the respective first ends of the light emitting elements, the first contact electrodes respectively coupling the light emitting elements to the first pixel electrode; and second contact electrodes on the respective second ends of the light emitting elements, the second contact electrodes respectively coupling the light emitting elements to the second pixel electrode.

Each of the light emitting elements may include: a first conductive semiconductor layer doped with a first conductive dopant; a second conductive semiconductor layer doped with a second conductive dopant; and an active layer between the first conductive semiconductor layer and the second conductive semiconductor layer.

According to another aspect of an embodiment of the present disclosure, there is provided a display device. The display device may include: a substrate including a display area having a plurality of pixel areas and a non-display area located around the display area; a circuit element layer including a circuit element in each of the pixel areas and a reference voltage wiring traversing the display area and electrically coupled to the circuit element; and a display element layer including a first pixel electrode on the circuit element layer in each of the pixel areas, a second pixel electrode located opposite to the first pixel electrode, a plurality of light emitting elements between the first pixel electrode and the second pixel electrode, and a first wiring on the circuit element layer in the non-display area, wherein the first wiring is directly coupled to the reference voltage wiring in the non-display area.

The reference voltage wiring may extend in a first direction, and the first wiring extends in a second direction intersecting the first direction.

The first wiring may include: a body portion that extends in the first direction; and a protruding portion that protrudes from the body portion in the second direction intersecting the first direction, wherein the protruding portion does not overlap the reference voltage wiring.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
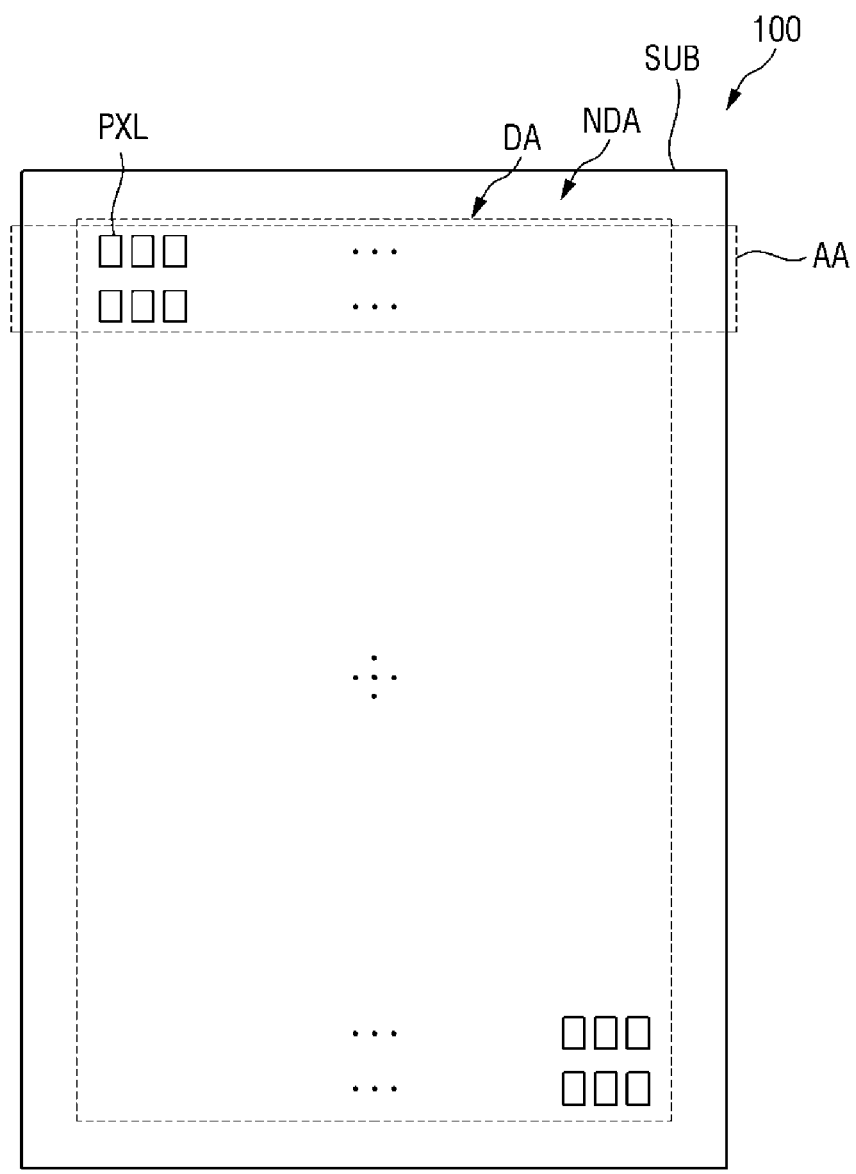
FIG. 1 is a schematic plan view of a display device according to an embodiment.

Features of embodiments of the present disclosure and methods for achieving those features will be apparent by referring to the embodiments described herein in more detail with reference to the accompanying drawings. However, the subject matter of the present disclosure is not limited to the embodiments disclosed hereinafter, but can be implemented in diverse forms. The matters defined in the description, such as the detailed construction and elements, are merely details provided to assist those of ordinary skill in the art in achieving a comprehensive understanding of the subject matter of the present disclosure, and the subject matter of the present disclosure is only defined within the scope of the appended claims, and equivalents thereof.

Where an element is described as being related to another element such as being "on" the other element or "located on" a different layer or a layer, includes both a case where the element is located directly on the other element or layer and a case where the element is located on the other element or layer via yet another layer or still another element. In contrast, where an element is described as being related to another element such as being "directly on" the other element or "located directly on" a different layer or a layer, indicates a case where the element is located on the other element or a layer with no intervening element or layer therebetween. Additionally, as used herein, the terms "couple," "coupled," and "coupling" may be synonymous with the terms "connect," "connected," and "connecting," respectively.

Throughout the present disclosure, the same reference numerals are used for the same or similar parts.

Hereinafter, embodiments of the present disclosure will be described with reference to the attached drawings.

FIG. 1 is a schematic plan view of a display device 100 according to an embodiment.

Referring to FIG. 1, the display device 100 may include a substrate SUB and pixels PXL on the substrate SUB.

The substrate SUB (or the display device 100) may include a display area DA and a non-display area NDA. Here, the display area DA may be an area where an image is displayed, and the non-display area NDA may be an area where no image is displayed. The display area DA may be at (or in) a central area of the display device 100, and the non-display area NDA may be located around (e.g., surrounding) the display area DA to surround the display area DA or may be in an edge area of the display device 100. However, embodiments are not limited to this case. For example, the non-display area NDA may be on only one side of the display area DA.

The substrate SUB may be a rigid substrate or a flexible substrate, and its material or physical properties are not particularly limited. For example, the substrate SUB may be a rigid substrate made of glass or tempered glass or a flexible substrate made of a thin plastic or metal film.

The pixels PXL may be on the display area DA of the substrate SUB. The substrate SUB (or the display area DA) may include a plurality of pixel areas, and the pixels PXL may be formed in the pixel areas, respectively. Wirings and/or internal circuit units coupled to the pixels PXL in the display area DA may be in the non-display area NA.

Each of the pixels PXL may include circuit elements and a plurality of light emitting elements LD. The circuit elements may transmit a current (e.g., a driving current) to the light emitting elements LD in response to a scan signal and a data signal received from an external source, and the light emitting elements LD may emit light having a luminance corresponding to the current. The light emitting elements LD may be as small as microscale or nanoscale, may be stick-shaped, and may be coupled in parallel to each other. The configuration of the light emitting elements LD will be described herein below with reference to FIG. 13.

FIGS. 2-6 are examples of an enlarged view of an area AA of FIG. 1. In FIGS. 2-6, major wirings and the light emitting elements LD in the pixels PXL (or PXA) are illustrated.

Figure 2:
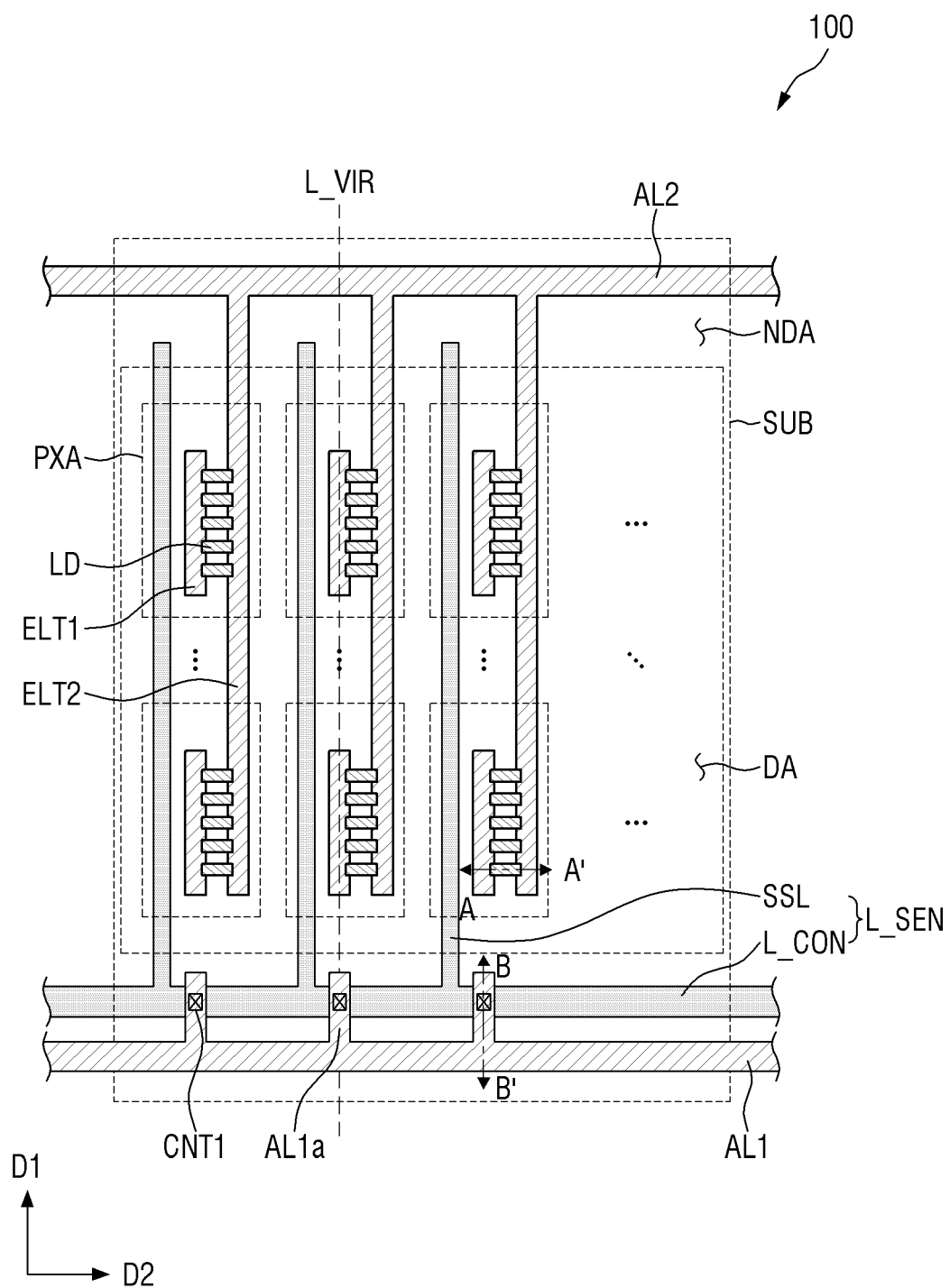
FIGS. 2-6 are enlarged views of example embodiments of an area AA of FIG. 1.

First, referring to FIGS. 1-2, the display device 100 may include a reference voltage wiring L_SEN, a first wiring AL1 (e.g., a first alignment wiring), a second wiring AL2 (e.g., a second alignment wiring), and the pixels PXL. Each of the pixels PXL may include a first pixel electrode ELT1, a second pixel electrode ELT2, and the light emitting elements LD.

The reference voltage wiring L_SEN may include sensing wirings (or sub-wirings) and a connecting wiring L_CON (or a main wiring). The sensing wirings SSL may extend in a first direction D1 to traverse the display area DA of the substrate SUB and may be repeatedly arranged along a second direction D2. Here, the second direction D2 may intersect the first direction D1 and may be, for example, perpendicular (e.g., substantially perpendicular) to the first direction D1. The connecting wiring L_CON may be on the non-display area NDA of the substrate SUB to extend in the second direction D2 and may be coupled to the sensing wirings SSL. The sensing wirings SSL and the connecting wiring L_CON may be integrally formed in the same process.

As will be described later with reference to FIG. 15, the reference voltage wiring L_SEN may be electrically coupled to an electrode (e.g., the first pixel electrode ELT1 or an anode) of each of the light emitting elements LD, may receive a reference voltage (or an initialization voltage), and may provide a path through which a sensing current corresponding to the initialization voltage moves from the electrode of each of the light emitting elements LD to the outside.

The first wiring AL1 may be on the non-display area NDA of the substrate SUB and extend in the second direction D2. The first wiring AL1 may be on a different layer from the reference voltage wiring L_SEN and may be directly coupled to the reference voltage wiring L_SEN. The first wiring AL1 may overlap the reference voltage wiring L_SEN and may be directly coupled to the reference voltage wiring L_SEN through first contact holes CNT1 (e.g., contact holes penetrating an insulating layer that insulates a layer in which the first wiring AL1 is located from a layer in which the reference voltage wiring L_SEN is located) located in overlap areas between the first wiring AL1 and the reference voltage wiring L_SEN.

The first wiring AL1 may include a body portion and protruding portions AL1a. The body portion may extend in the second direction D2, and the protruding portions AL1a may protrude from the body portion in the first direction D1.

As illustrated in FIG. 2, the body portion may not overlap the reference voltage wiring L_SEN, and the protruding portions AL1a may overlap the reference voltage wiring L_SEN. In this case, the first wiring AL1 may be coupled to the reference voltage wiring L_SEN by the protruding portions AL1a. However, this is just an example, and embodiments are not limited to this example.

Figure 3:
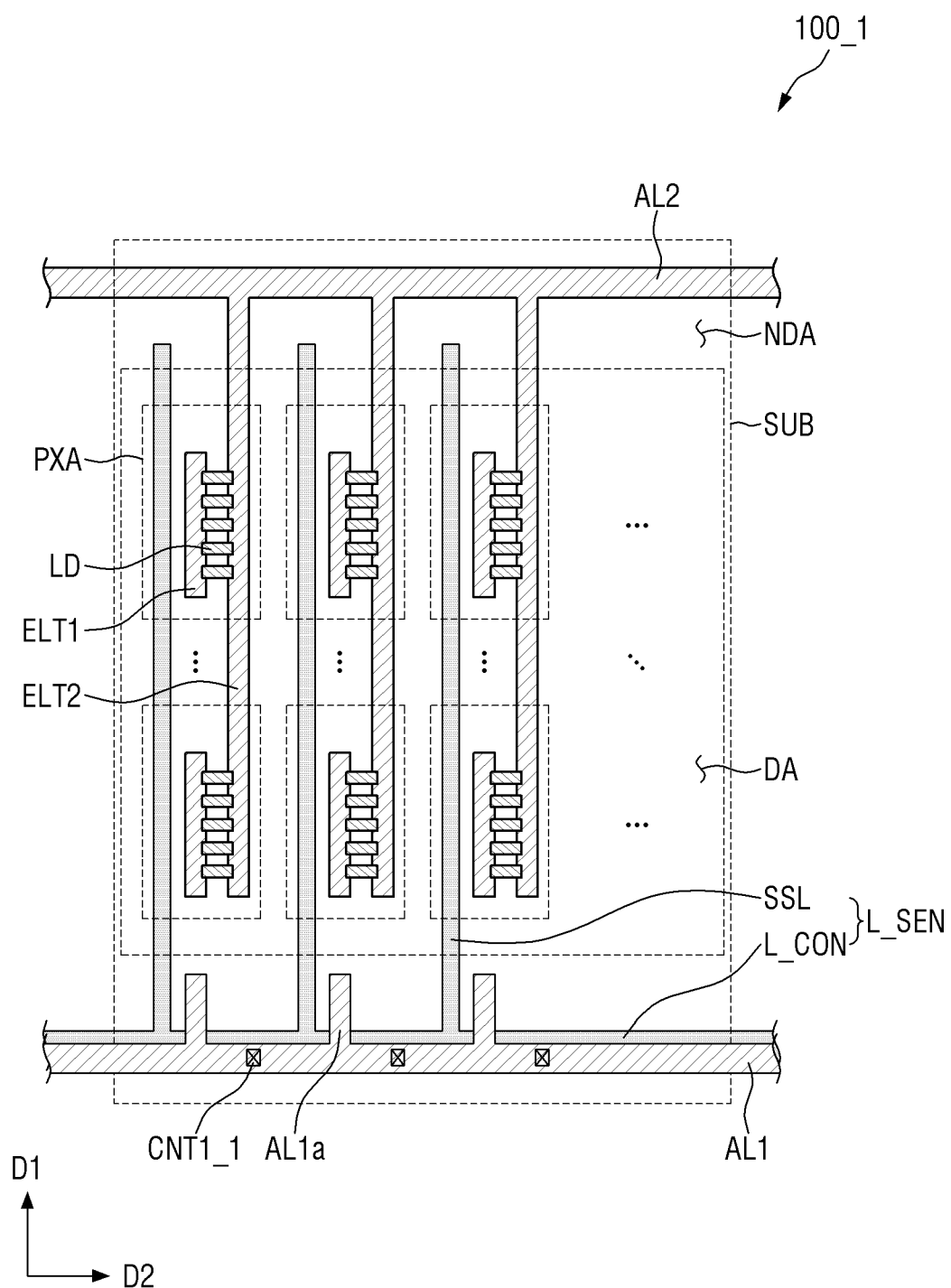

For example, referring to a display device 100_1 of FIG. 3, a body portion of a first wiring AL1 may overlap a reference voltage wiring L_SEN. In this case, first contact holes CNT1_1 may be located in overlap areas between the body portion of the first wiring AL1 and the reference voltage wiring L_SEN. For another example, referring to a display device 100_2 of FIG. 4, a first wiring AL1 may be located closer to a display area DA than a connecting wiring L_CON and may overlap sensing wirings SSL of a reference voltage wiring L_SEN. In this case, first contact holes CNT1_2 may be located in overlap areas between the first wiring AL1 and the sensing wirings SSL.

Referring again to FIG. 2, the second wiring AL2 may be on the non-display area NDA of the substrate SUB and may be located opposite to the first wiring AL1 with respect to the display area DA. As illustrated in FIG. 2, the first wiring AL1 (and the reference voltage wiring L_SEN) may be adjacent to a side of the display area DA, and the second wiring AL2 may be adjacent to the other side of the display area DA.

The first pixel electrode ELT1 may be in each pixel area PXA. The first pixel electrode ELT1 may be longer in the first direction D1 than in the second direction D2.

In embodiments, the first pixel electrode ELT1 may be located on an extension line L_VIR of each protruding portion AL1a of the first wiring AL1. The first pixel electrode ELT1 and the first wiring AL1 may be formed by separating one common wiring (or a mother wiring) using, e.g., an etching process. For example, the protruding portions AL1a of the first wiring AL1 may be stubs generated during the etching process.

The second pixel electrode ELT2 may be located opposite to the first pixel electrode ELT1 in each of the pixel areas PXA. The second pixel electrode ELT2 may extend in the first direction D1 and extend to another pixel area. The second pixel electrode ELT2 may be coupled to the second wiring AL2. As will be described later, the second pixel electrode ELT2 may be integrally formed with the first pixel electrode ELT1 in the same process.

The light emitting elements LD may be between the first pixel electrode ELT1 and the second pixel electrode ELT2. An end of each of the light emitting elements LD may be coupled to the first pixel electrode ELT1, and the other end of each of the light emitting elements LD may be coupled to the second pixel electrode ELT2.

In the process of aligning the light emitting elements LD, alignment voltages may be applied to the first wiring AL1 and the second wiring AL2, and the reference voltage wiring L_SEN may be coupled to the first wiring AL1 to lower the resistance (e.g., the electrical resistance) of the first wiring AL1 and reduce a drop in the alignment voltages. Accordingly, a stronger electric field may be formed between the first pixel electrode ELT1 and the second electrode ELT2 coupled to the first wiring AL1 and the second wiring AL2, and the alignment efficiency of the light emitting elements LD may be improved. In addition, even after the alignment of the light emitting elements LD, the first wiring AL1 may be coupled to the reference voltage wiring L_SEN to lower the resistance (e.g., the electrical resistance) of the reference voltage wiring L_SEN and prevent or reduce a drop in the reference voltage applied to the reference voltage wiring L_SEN during the driving of the display device 100.

As described above with reference to FIGS. 2-4, the display device 100 can improve the alignment efficiency of the light emitting elements LD by coupling the reference voltage wiring L_SEN and the first wiring AL1.

Figure 4:
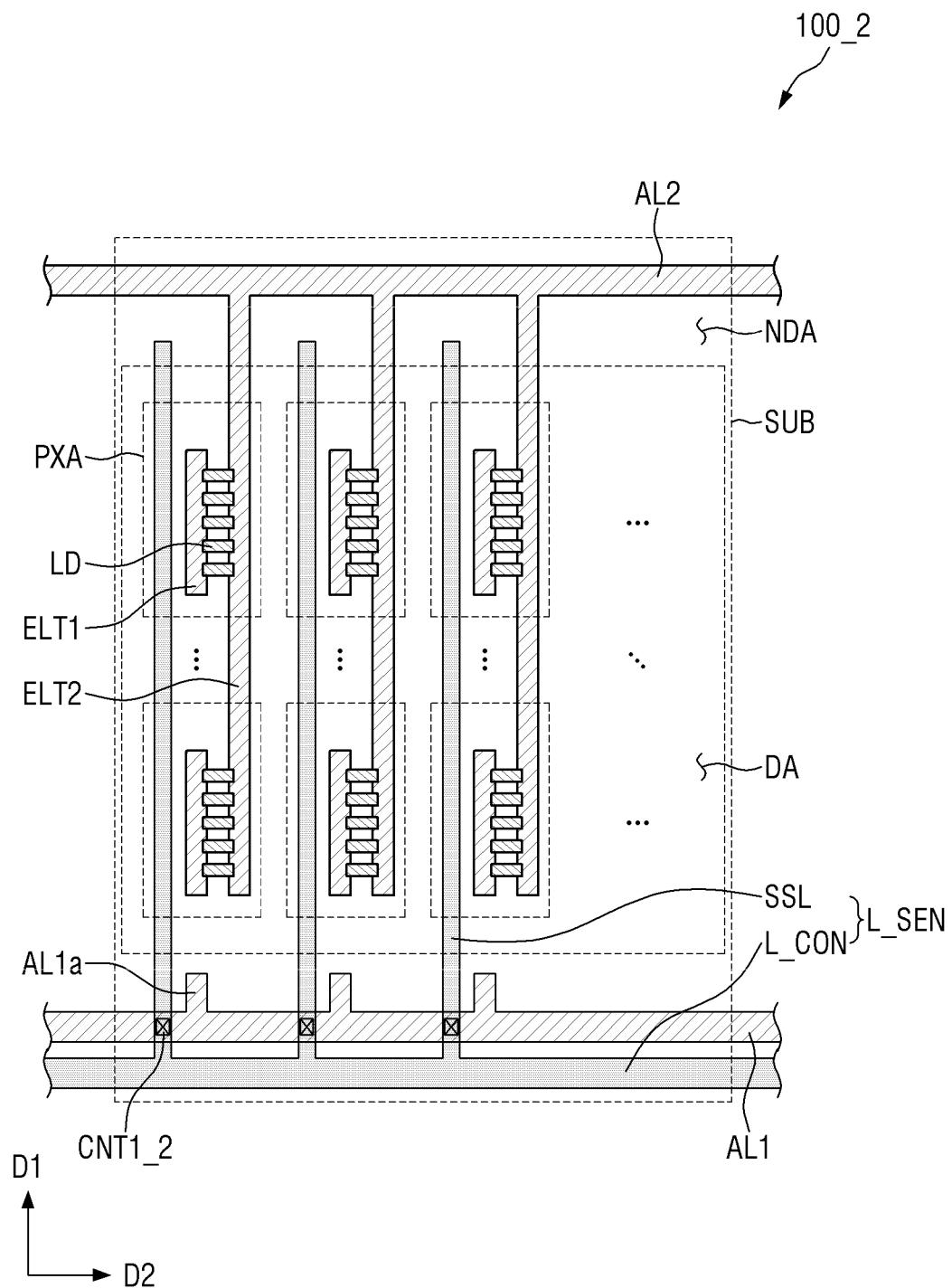
Figure 5:
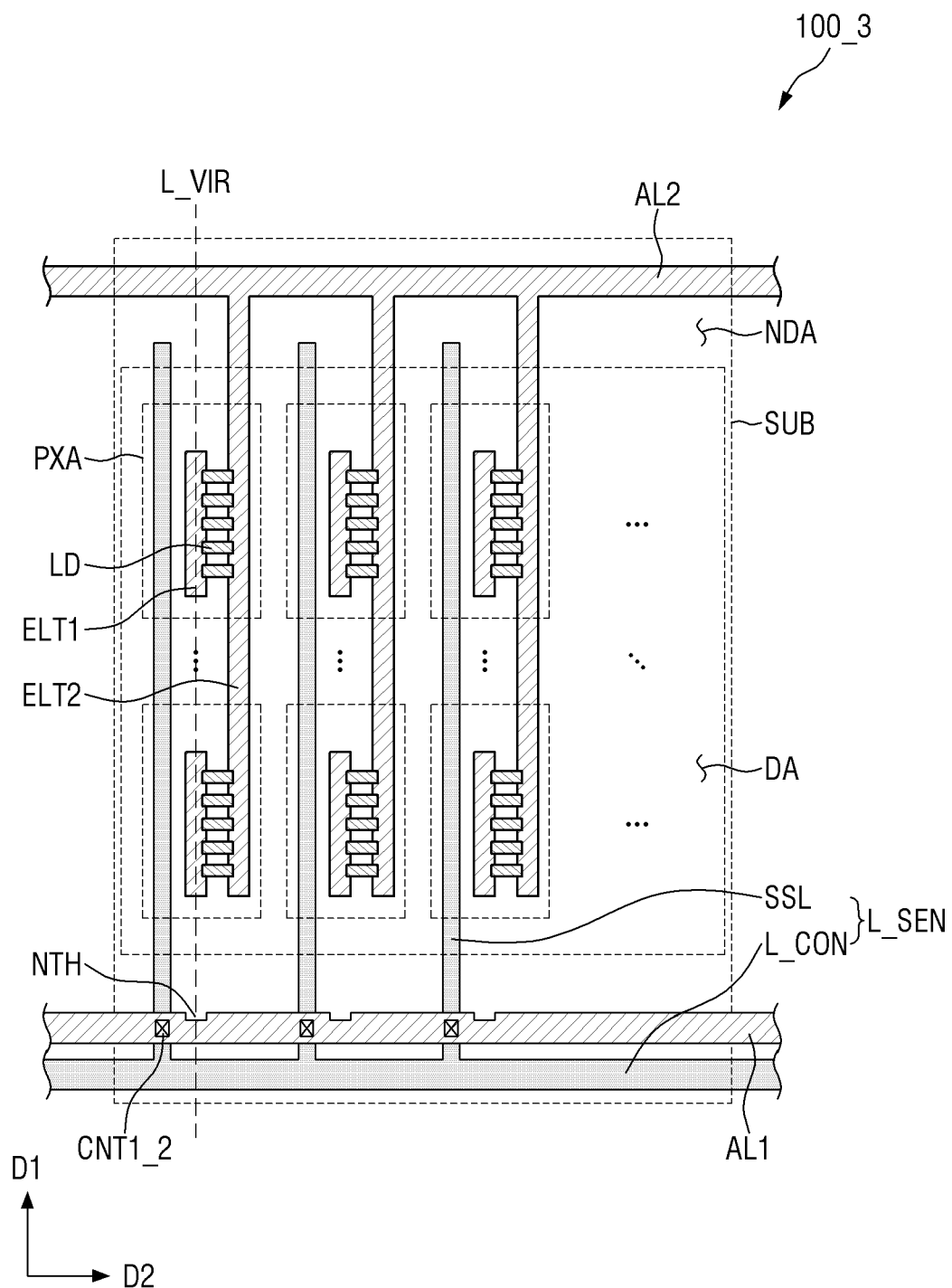
Figure 6:
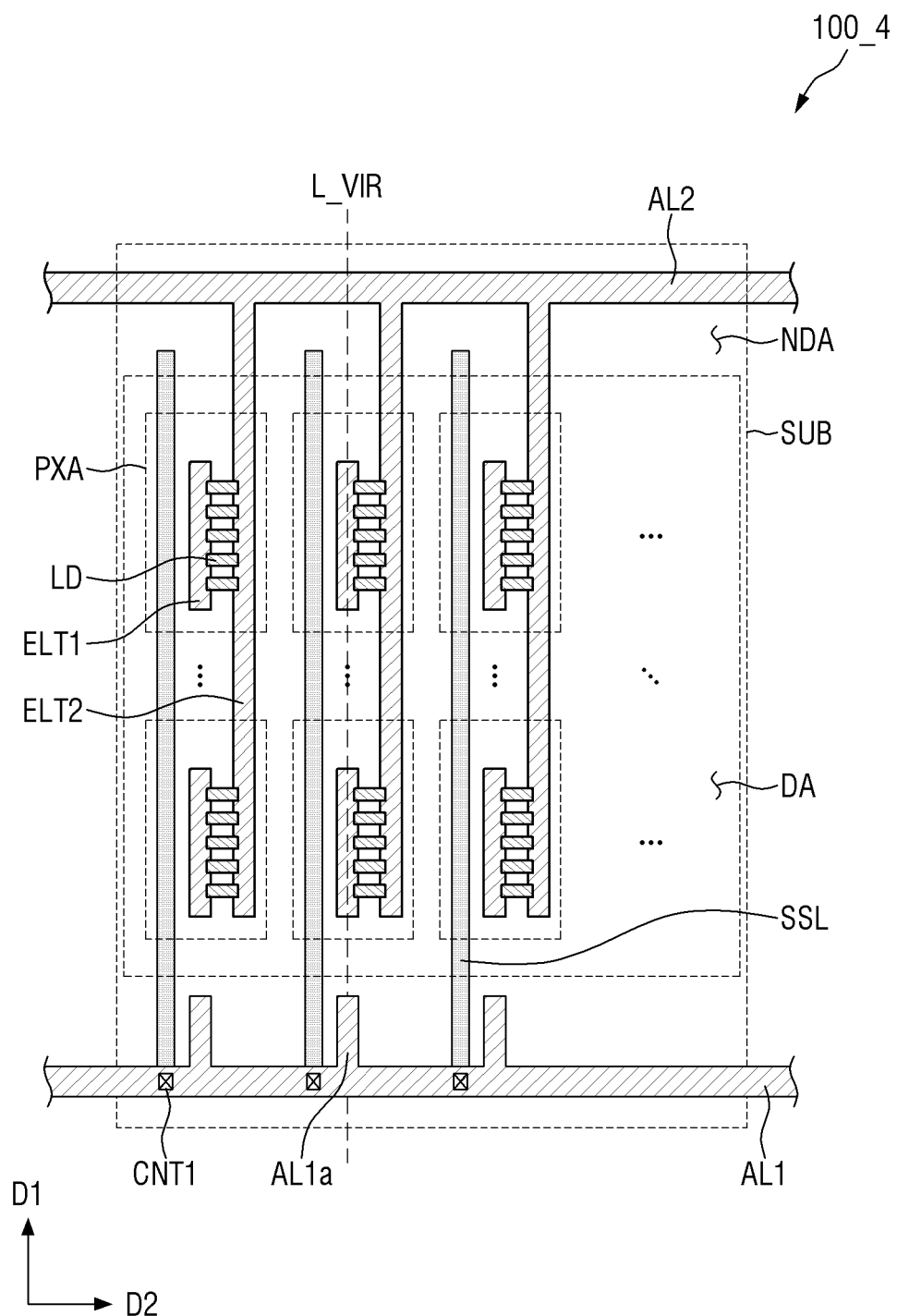

Although the first wiring AL includes the protruding portions AL1a in FIGS. 2-4, this is just an example, and embodiments are not limited to this example. Referring to a display device 100_3 of FIG. 5, a first wiring AL1 may include recessed portions NTH instead of the protruding portions AL1a. Each of the recessed portions NTH may be located on an extension line L_VIR on which a first pixel electrode ELT1 is located. In the process of etching a common wiring into the first wiring AL1 and the first pixel electrode ELT1, the recessed portions NTH may be formed instead of stubs if etching is performed adjacent to the first wiring AL1.

In addition, although the reference voltage wiring L_SEN includes the connecting wiring L_CON coupled to the sensing wirings SSL in FIGS. 2-4, embodiments are not limited to this case. For example, referring to a display device 100_4 of FIG. 6, a reference voltage wiring L_SEN may include only sensing wirings SSL coupled to a first wiring AL1.

Figure 7:
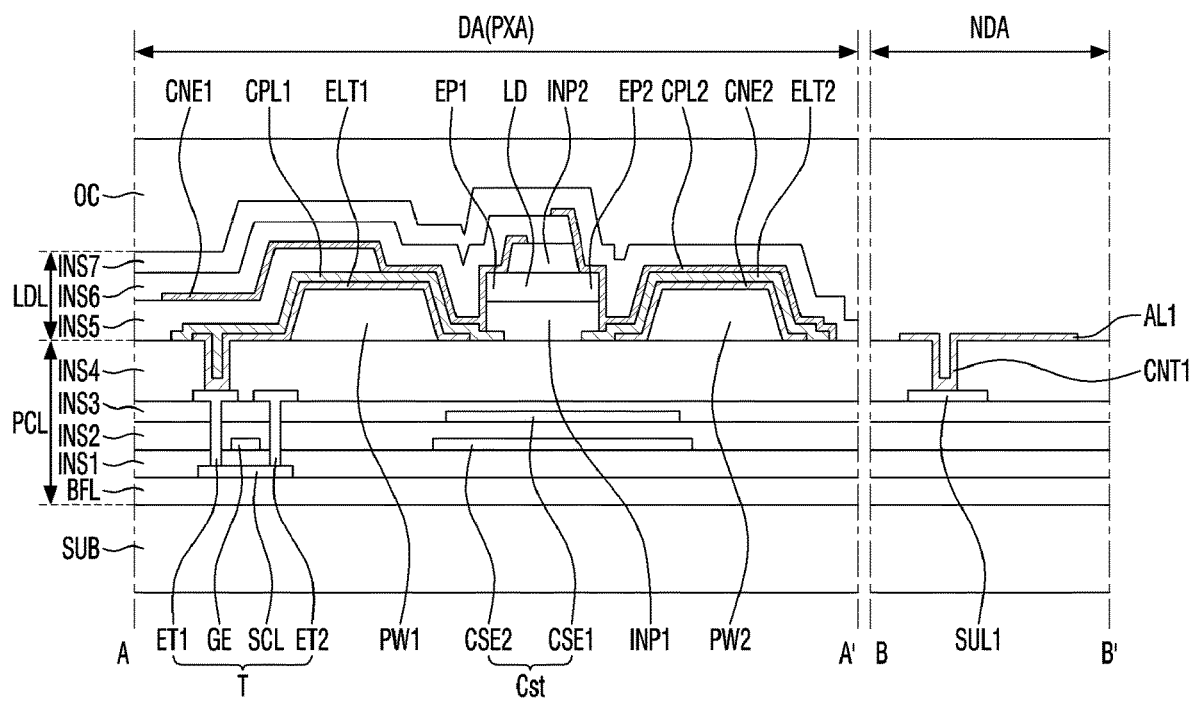
FIG. 7 is a cross-sectional view of an example embodiment of the display device taken along the lines A-A' and B-B' of FIG. 2.

FIG. 7 is a cross-sectional view of an example of the display device 100 taken along lines A-A' and B-B' of FIG. 2. FIGS. 8-12 are cross-sectional views of various examples of the display device 100 taken along the lines A-A' and B-B' of FIG. 2.

Referring first to FIGS. 2-7, a circuit element layer PCL and a display element layer LDL are sequentially arranged on the display area DA of the substrate SUB. For example, the circuit element layer PCL may be formed a surface of the substrate SUB, and the display element layer LDL may be formed on the circuit element layer PCL.

The circuit element layer PCL includes circuit elements on the display area DA. The circuit element layer PCL may include circuit elements formed in each pixel area PXA and constituting each pixel circuit PXC. For example, the circuit element layer PCL may include at least one transistor T and a storage capacitor Cst in each pixel area PXA.

Although a pixel PXL includes one transistor T in FIG. 7, this is just an example. A pixel PXL may also include a plurality of transistors, and the transistors may have substantially the same or similar cross-sectional structure as the transistor T. In addition, the structure of the transistor T is not limited to the embodiment illustrated in FIG. 7. For example, the transistor T can have any of various suitable cross-sectional structures generally used in the art. Transistors constituting each pixel circuit PXC may be of different types (or kinds) and/or have different structures.

The circuit element layer PCL includes a plurality of insulating layers. The circuit element layer PCL may include first through fourth insulating layers INS1 through INS4 stacked sequentially on the surface of the substrate SUB. The first through fourth insulating layers INS1 through INS4 may be sequentially stacked between the substrate SUB and the display element layer LDL. In addition, the circuit element layer PCL may further include at least one buffer layer BFL between the substrate SUB and the circuit elements. At least one of the first through fourth insulating layers INS1 through INS4 and the buffer layer BFL may be formed on the surface of the substrate SUB including the display area DA and the non-display area NDA.

The buffer layer BFL may prevent or reduce diffusion of impurities to the transistor T. The buffer layer BFL may be formed as a single layer, but may also be formed as a multilayer composed of two or more layers. When the buffer layer BFL is provided as a multilayer, constituent layers of the multilayer may be made of the same material or different materials. The buffer layer BFL can be omitted.

The transistor T includes a semiconductor layer SCL, a gate electrode GE, a first electrode ET1 and a second electrode ET2. Although the transistor T includes the first electrode ET1 and the second electrode ET2 formed separate from the semiconductor layer SCL in FIG. 7, embodiments are not limited to this case. For example, the first and/or second electrodes (or electrode) ET1 and/or ET2 of at least one transistor T in each pixel area PXA may be integrated with the semiconductor layer SCL.

The semiconductor layer SCL may be on the buffer layer BFL. The semiconductor layer SCL may be between the substrate SUB having the buffer layer BFL and the first insulating layer INS1. The semiconductor layer SCL may include a first region which contacts the first electrode ET1, a second region which contacts the second electrode ET2, and a channel region which is located between the first region and the second region. One selected from the first region and the second region may be a source region, and the other may be a drain region.

The semiconductor layer SCL may be a semiconductor pattern made of polysilicon, amorphous silicon, or an oxide semiconductor. In addition, the channel region of the semiconductor layer SCL may be a semiconductor pattern undoped with impurities and may be an intrinsic semiconductor. Each of the first region and the second region of the semiconductor layer SCL may be a semiconductor pattern doped with set or predetermined impurities.

The gate electrode GE may be on the semiconductor layer SCL with the first insulating layer INS1 interposed between the gate electrode GE and the semiconductor layer SCL. For example, the gate electrode GE may be between the first insulating layer INS1 and the second insulating layer INS2 and overlap at least a region of the semiconductor layer SCL.

The first electrode ET1 and the second electrode ET2 may be on the semiconductor layer SCL with at least one insulating layer, for example, a plurality of insulating layers, interposed between the first electrode ET1 and the second electrode ET2 and the semiconductor layer SCL. For example, the first electrode ET1 and the second electrode ET2 may be between the third insulating layer INS3 and the fourth insulating layer INS4. The first electrode ET1 and the second electrode ET2 may be electrically coupled to the semiconductor layer SCL. For example, the first electrode ET1 and the second electrode ET2 may contact the first region and the second region of the semiconductor layer SCL through contact holes penetrating the first insulating layer INS1, the second insulating layer INS2, and the third insulating layer INS3, respectively.

Any one of the first electrode ET1 and the second electrode ET2 may be electrically coupled to the first pixel electrode ELT1 on the fourth insulating layer INS4 via at least one contact hole penetrating the fourth insulating layer INS4.

The storage capacitor Cst may include a first capacitor electrode CSE1 and a second capacitor electrode CSE2 on different layers and spaced apart from each other. The first capacitor electrode CSE1 may be between the second insulating layer INS2 and the third insulting layer INS3. The second capacitor electrode CSE2 may be on the same layer as at least one of the conductive layers constituting the transistor T1, for example, at least one of the semiconductor layer SCL, the gate electrode GE and the first electrode ET1 and the second electrode ET2. For example, the second capacitor electrode CSE2 may be between the first insulating layer INS1 and the second insulating layer INS2, together with the gate electrode GE of the transistor T.

Although each of the first capacitor electrode CSE1 and the second capacitor electrode CSE2 is illustrated in FIG. 7 as a single layer for ease of description, embodiments are not limited to this case. For example, at least one of the first capacitor electrode CSE1 and the second capacitor electrode CSE2 may be formed as a multilayer, and the stacked structure and/or position of the first capacitor electrode CSE1 and the second capacitor electrode CSE2 may be variously changed.

According to an embodiment, the display element layer LDL may include a plurality of light emitting elements LD located above the circuit element layer PCL in the display area DA (e.g., the pixel area of the display area DA(PXA)). For example, the display element layer LDL may include a plurality of light emitting elements LD formed above the circuit element layer PCL in each pixel area PXA and constituting each light emitting unit.

Although only one light emitting element LD is illustrated in FIG. 7 for convenience, a plurality of light emitting elements LD may be in each pixel area PXA. In addition, in each pixel area PXA, the light emitting elements LD may be on substantially the same layer and may have the same or similar cross-sectional structure and/or connection structure. Further, the structure and position of each light emitting element LD are not limited to the embodiment illustrated in FIG. 7. For example, each of the light emitting elements LD may have any of various suitable cross-sectional structures and/or connection structures generally available in the art.

The display element layer LDL may include the first pixel electrode ELT1 and the second pixel electrode ELT2 in each pixel area PXA, the light emitting elements LD between the first pixel electrode ELT1 and the second pixel electrode ELT2 corresponding to each other, and a first contact electrode CNE1 and a second contact electrode CNE2 respectively on a first end EP1 and a second end EP2 of each of the light emitting elements LD. In addition, the display element layer LDL may further include at least one conductive layer and/or insulating layer. The display element layer LDL may further include at least one of a first barrier rib PW1 and a second barrier rib PW2, a first capping layer CPL1 and a second capping layer CPL2, and fifth through seventh insulating layers INS5 through INS7.

The first barrier rib PW1 and the second barrier rib PW2 may be on the fourth insulating layer INS4 of the circuit element layer PCL. The first barrier rib PW1 and the second barrier rib PW2 on the fourth insulating layer INS4 may be spaced apart from each other by a set or predetermined distance. The first barrier rib PW1 and the second barrier rib PW2 may define a light emitting area in each pixel area PXA.

Figure 12:
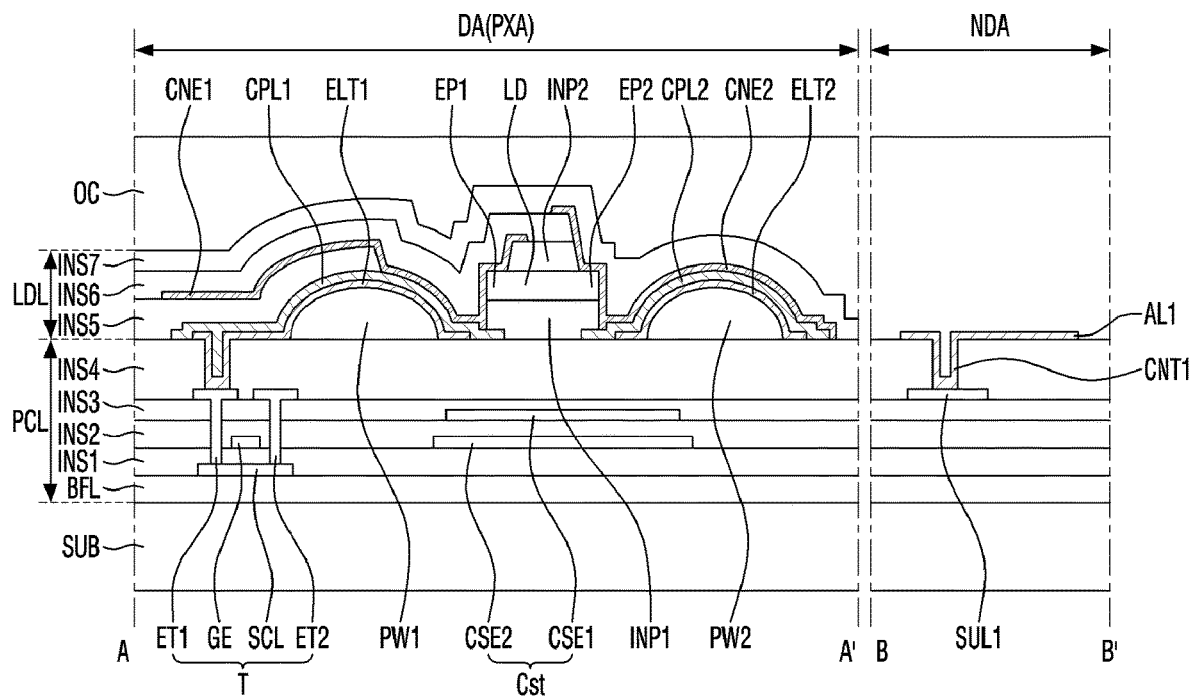

Each of the first barrier rib PW1 and the second barrier rib PW2 may include an insulating material containing an inorganic material or an organic material, but the constituent material of each of the first barrier rib PW1 and the second barrier rib PW2 is not limited to this example. In addition, each of the first barrier rib PW1 and the second barrier rib PW2 may be shaped like a trapezoid whose sides are inclined at a set or predetermined angle. However, the shape of each of the first barrier rib PW1 and the second barrier rib PW2 is not limited to the trapezoidal shape. For example, each of the first barrier rib PW1 and the second barrier rib PW2 may have a semi-elliptical shape as illustrated in FIG. 12 or may have various other suitable shapes such as a circle and a quadrilateral.

The first pixel electrode ELT1 and the second pixel electrode ELT2 may be on each pixel area PXA having the first barrier rib PW1 and the second barrier rib PW2. The first pixel electrode ELT1 and the second pixel electrode ELT2 may be on the substrate SUB having the first barrier rib PW1 and the second barrier rib PW2 and may be spaced apart from each other by a set or predetermined distance.

The first pixel electrode ELT1 may be on the first barrier rib PW1, and the second pixel electrode ELT2 may be on the second barrier rib PW2. Any one of the first pixel electrode ELT1 and the second pixel electrode ELT2 may be an anode, and the other may be a cathode.

The first pixel electrode ELT1 and the second pixel electrode ELT2 may have a shape corresponding to the shape of the first barrier rib PW1 and the second barrier rib PW2. For example, the first pixel electrode ELT1 may have a slope corresponding to the slope of the first barrier rib PW1, and the second pixel electrode ELT2 may have a slope corresponding to the slope of the second barrier rib PW2.

In addition, the first pixel electrode ELT1 and the second pixel electrode ELT2 may lie in the same (or substantially the same) plane and may have the same (or substantially the same) height. If the first pixel electrode ELT1 and the second pixel electrode ELT2 have the same (or substantially the same) height, the light emitting elements LD may be more stably coupled between the first pixel electrode ELT1 and the second pixel electrode ELT2. However, embodiments are not limited to this case, and the shape, structure and/or arrangement relationship of the first pixel electrode ELT1 and the second pixel electrode ELT2 can be variously changed.

The first pixel electrode ELT1 and the second pixel electrode ELT2 may be formed as reflective electrodes. However, embodiments are not limited to this case. For example, the first pixel electrode ELT1 and the second pixel electrode ELT2 may be made of a conductive material having certain reflectivity. For example, the first pixel electrode ELT1 and the second pixel electrode ELT2 may include, but is not limited to, at least one of a metal such as Ag, Mg, Al, Pt, Pd, Au, Ni, Nd, Ir, Cr or an alloy of these metals, a conductive oxide such as indium zinc oxide (IZO), zinc oxide (ZnO) or indium tin zinc oxide (ITZO), and a conductive polymer such as PEDOT. In addition, each of the first pixel electrode ELT1 and the second pixel electrode ELT2 may be formed as a single layer or a multilayer, and its stacked structure is not limited.

The first pixel electrode ELT1 and the second pixel electrode ELT2 may direct light emitted from both ends EP1 and EP2 of each of the light emitting elements LD in a direction in which an image is displayed (e.g., a direction toward the front of the display device 100). When the first pixel electrode ELT1 and the second pixel electrode ELT2 have a slope corresponding to the shape of the first barrier rib PW1 and the second barrier rib PW2, light emitted from both ends EP1 and EP2 of each of the light emitting elements LD may be reflected by the first pixel electrode ELT1 and the second pixel electrode ELT2 toward the front of the display device 100. Accordingly, the efficiency of light emitted from the light emitting elements LD can be improved.

In addition, the first barrier rib PW1 and the second barrier rib PW2 may function as reflective members. The first barrier rib PW1 and the second barrier rib PW2 may function as reflective members for improving the efficiency of light output from each of the light emitting elements LD, together with the first pixel electrode ELT1 and the second pixel electrode ELT2 provided on the first barrier rib PW1 and the second barrier rib PW2.

The first capping layer CPL1 and the second capping layer CPL2 may be on each pixel area PXA having the first pixel electrode ELT1 and the second pixel electrode ELT2. For example, the first capping layer CPL1 may be on the first pixel electrode ELT1 to cover the first pixel electrode ELT1, and the second capping layer CPL2 may be on the second pixel electrode ELT2 to cover the second pixel electrode ELT2.

The first capping layer CPL1 and the second capping layer CPL2 may be made of a transparent conductive material such as IZO in order to minimize or reduce a loss of light emitted from each of the light emitting elements LD. However, embodiments are not limited to this case, and the constituent material of the first capping layer CPL1 and the second capping layer CPL2 can be changed.

The first capping layer CPL1 and the second capping layer CPL2 may prevent or reduce damage to the first pixel electrode ELT1 and the second pixel electrode ELT2 due to a defect that occurs during a manufacturing process of a light emitting display device and may increase the adhesion between the first pixel electrode ELT1 and the second pixel electrode ELT2 and the circuit element layer PCL. At least one of the first capping layer CPL1 and the second capping layer CPL2 can be omitted.

First insulating patterns INP1 may be on each pixel area PXA having the first capping layer CPL1 and the second capping layer CPL2. A first insulating pattern INP1 may be between the circuit element layer PCL and each of the light emitting elements LD and may cover respective areas of the first capping layer CPL1 and the second capping layer CPL2. The first insulating patterns INP1 may stably support the light emitting elements LD and prevent or reduce displacement of the light emitting elements LD. The first insulating patterns INP1 may be formed at the same (or substantially the same) time as any one of the insulating layers formed in the display element layer LDL or may be formed independently.

The light emitting elements LD may be supplied and aligned on each pixel area PXA having the first insulating patterns INP1. The light emitting elements LD may be induced to be self-aligned by an electric field formed between the first pixel electrode ELT1 and the second pixel electrode ELT2 and may be between the first pixel electrode ELT1 and the second pixel electrode ELT2 of each pixel area PXA.

Second insulating patterns INP2 may be on each pixel area PXA having the light emitting elements LD and partially cover upper surfaces of the light emitting elements LD. The second insulating patterns INP2 may be formed at the same (or substantially the same) time as any one of the insulating layers formed in the display element layer LDL or may be formed independently.

The fifth insulating layer INS5 may be formed on a part of an upper surface of the first capping layer CPL1. The fifth insulating layer INS5 may be formed at the same (or substantially the same) time as any one of the first insulating pattern INP1 and the second insulating pattern INP2 or may be formed independently. The fifth insulating layer INS5 can be omitted.

The first contact electrode CNE1 may be on each pixel area PXA having the second insulating patterns INP2 and the fifth insulating layer INS5. The first contact electrode CNE1 may cover the first capping layer CPL1 and may be electrically coupled to the first pixel electrode ELT1 through the first capping layer CPL1. When the first capping layer CPL1 is omitted, the first contact electrode CNE1 may be provided directly on the first pixel electrode ELT1 and may be directly coupled to the first pixel electrode ELT1. In addition, the first contact electrode CNE1 may cover the first end EP1 of at least one light emitting element LD in each pixel area PXA and couple the first end EP1 of the at least one light emitting element LD to the first pixel electrode ELT1.

The sixth insulating layer INS6 may be on each pixel area PXA having the first contact electrode CNE1. The sixth insulating layer INS6 may cover the first contact electrode CNE1 and the fifth insulating layer INS5.

The second contact electrode CNE2 may be on each pixel area PXA having the sixth insulating layer INS6. The second contact electrode CNE2 may cover the second capping layer CPL2 and may be electrically coupled to the second pixel electrode ELT2 through the second capping layer CPL2. When the second capping layer CPL2 is omitted, the second contact electrode CNE2 may be provided directly on the second pixel electrode ELT2 and may be directly coupled to the second pixel electrode ELT2. In addition, the second contact electrode CNE2 may cover the second end EP2 of at least one light emitting element LD in each pixel area PXA and couple the second end EP2 of the at least one light emitting element LD to the second pixel electrode ELT2.

The seventh insulating layer INS7 and an overcoat layer OC may be on each pixel area PXA having the second contact electrode CNE2. According to an embodiment, the seventh insulating layer INS7 may be provided on the surface of the substrate SUB including the display area DA and the non-display area NDA, and the overcoat layer OC may cover an upper surface of the seventh insulating layer INS7.

Meanwhile, the reference voltage wiring L_SEN and the first wiring AL1 (and the second wiring AL2) may be on the non-display area NDA. The reference voltage wiring L_SEN may be on the non-display area NDA of the substrate SUB, and the first wiring AL1 may be overlap the reference voltage wiring L_SEN.

The first wiring AL1 may be on the fourth insulating layer INS4 of the circuit element layer PCL. The first wiring AL1 may be formed on the same layer as at least one of the first pixel electrode ELT1 and the second pixel electrode ELT2. The first wiring AL1 may be formed on the same layer as the first pixel electrode ELT1 and the second pixel electrode ELT2 in the process of forming the first pixel electrode ELT1 and the second pixel electrode ELT2.

The first wiring AL1 may also be on the same layer as at least one of the first capping layer CPL1 and the second capping layer CPL2 and the first contact electrode CNE1 and the second contact electrode CNE2. The first wiring AL1 may be formed on the same layer as the first capping layer CPL1 and the second capping layer CPL2 in the process of forming the first capping layer CPL1 and the second capping layer CPL2 or may be formed on the same layer as the first contact electrode CNE1 and the second contact electrode CNE2 in the process of forming the first contact electrode CNE1 and the second contact electrode CNE2.

The first wiring AL1 may also have a multilayer structure including a plurality of conductive layers respectively on the same layer as a plurality of electrodes on different layers among the first pixel electrode ELT1 and the second pixel electrode ELT2, the first capping layer CPL1 and the second capping layer CPL2, and the first contact electrode CNE1 and the second contact electrode CNE2. For example, referring to FIG. 11, the first wiring AL1 may include a first conductive wiring AL1a and a second conductive wiring AL1b overlapping the first conductive wiring AL1a. The first conductive wiring AL1a may be on the same layer as the first pixel electrode ELT1 and the second pixel electrode ELT2 or the first capping layer CPL1 and the second capping layer CPL2. The second conductive wiring AL1b may be on the same layer as the first capping layer CPL1 and the second capping layer CPL2 or the first contact electrode CNE1 and the second contact electrode CNE2.

The reference voltage wiring L_SEN may be on the same layer as at least one of the electrodes formed in the circuit element layer PCL.

For example, as illustrated in FIG. 7, the reference voltage wiring L_SEN may include a first sub-wiring SUL1 between the third insulating layer INS3 and the fourth insulating layer INS4 together with the first electrode ET1 of the transistor T1. In this case, the first wiring AL1 may contact the first sub-wring SUL1 through the first contact hole CNT1 penetrating the fourth insulating layer INS4.

Figure 8:
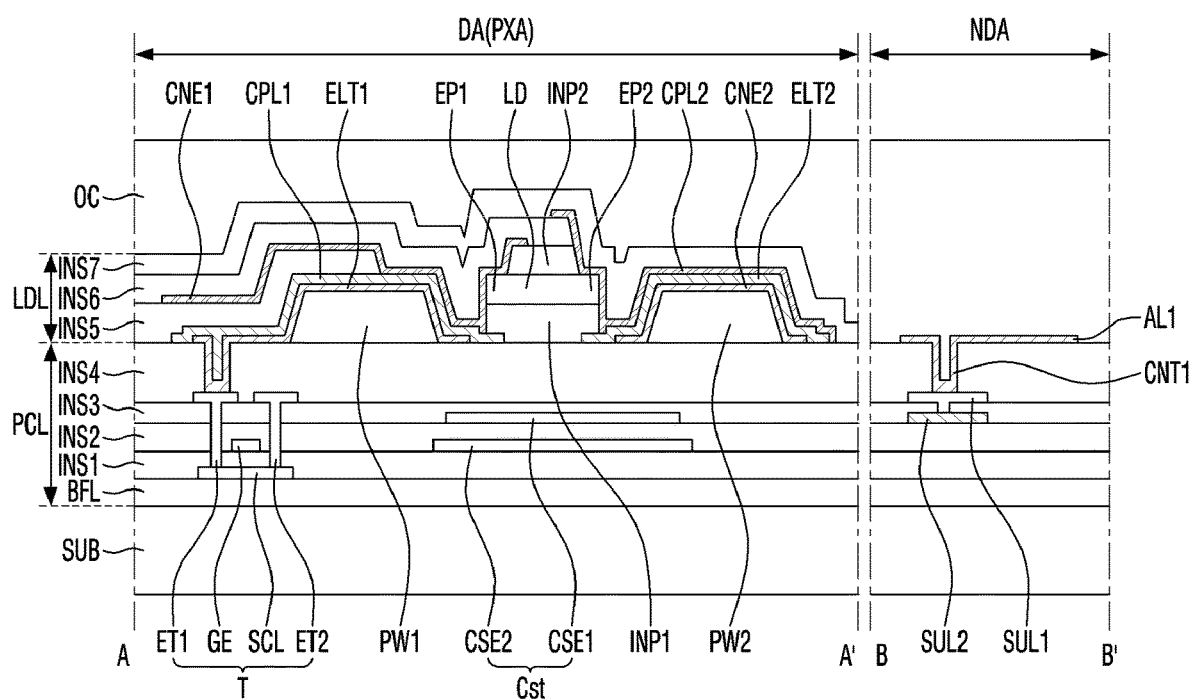
FIGS. 8-12 are cross-sectional views of various example embodiments of the display device taken along the lines A-A' and B-B' of FIG. 2.
Figure 9:
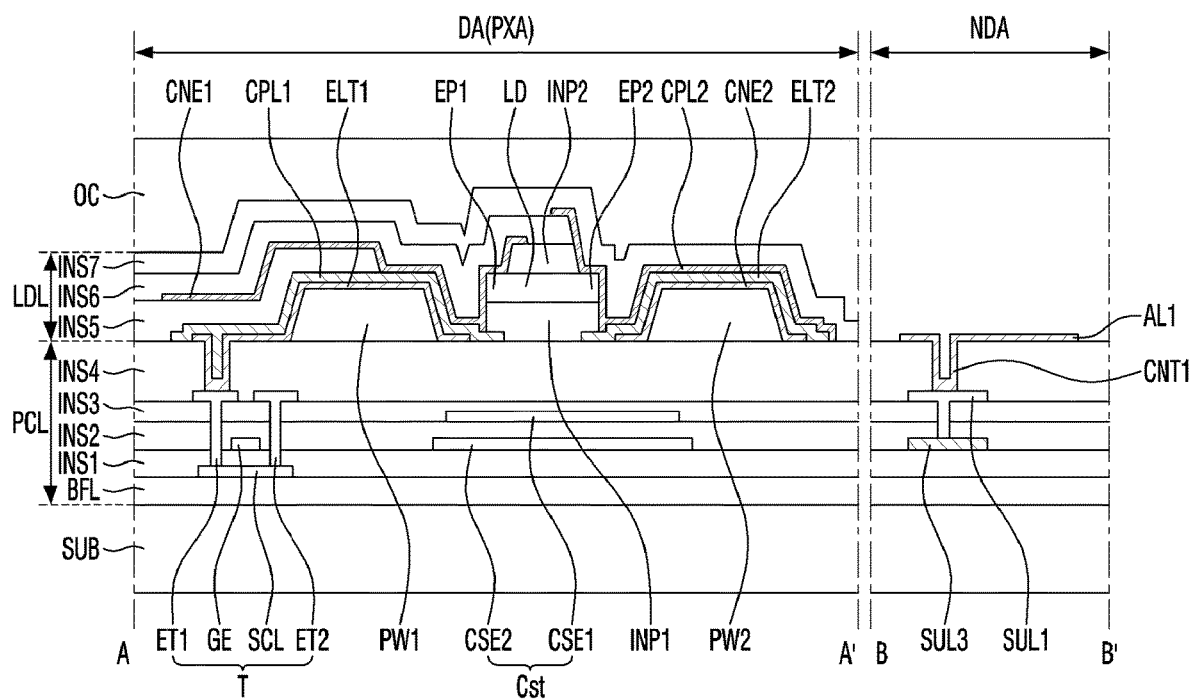
Figure 10:
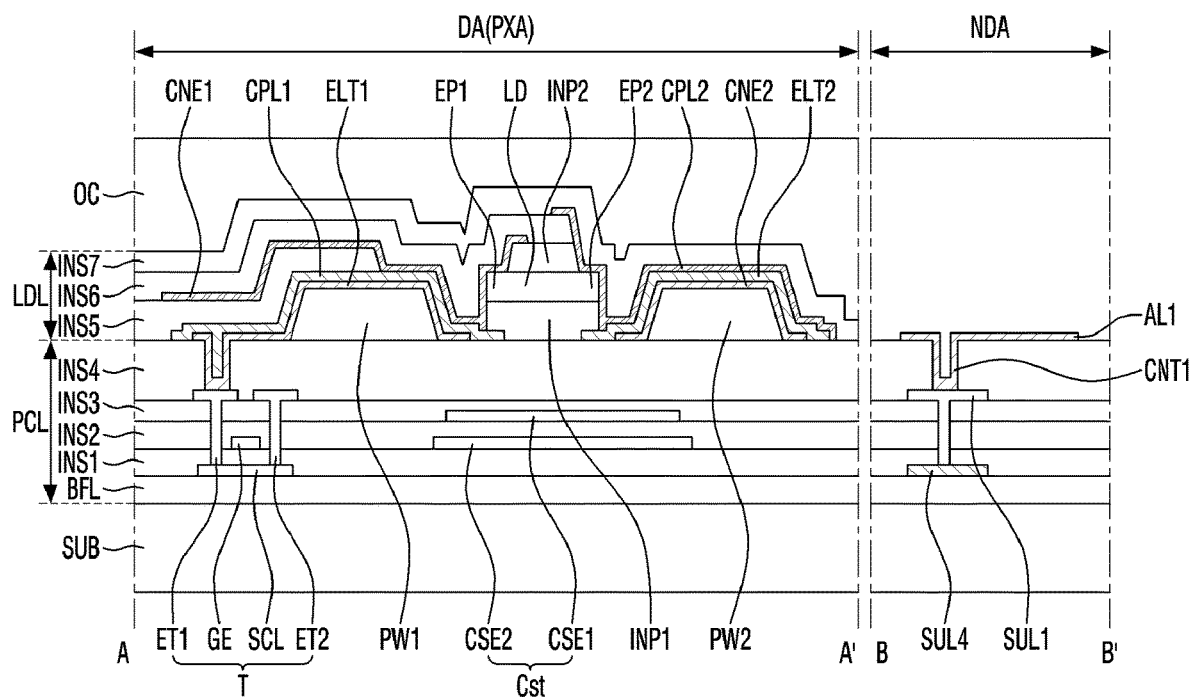
Figure 11:
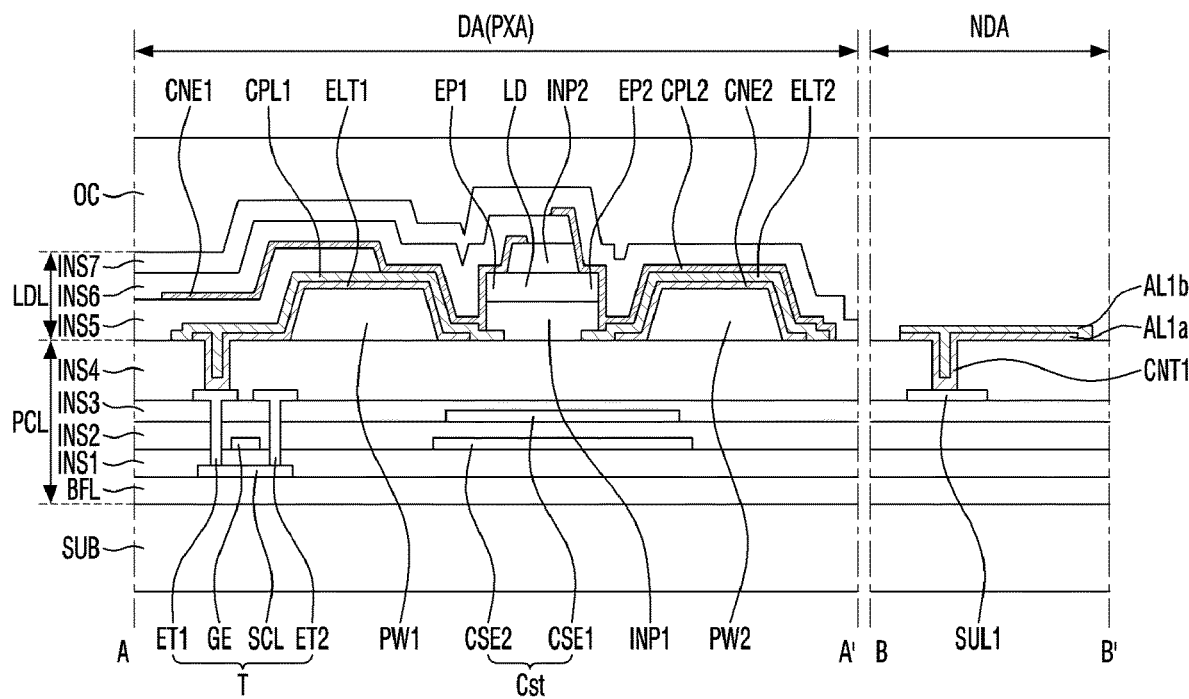

For another example, the reference voltage wiring L_SEN may further include a second sub-wiring SUL2 between the second insulating layer INS2 and the third insulating layer INS3 together with the first capacitor electrode CSE1 as illustrated in FIG. 8 or may include a third sub-wiring SUL3 between the first insulating layer INS1 and the second insulating layer INS2 together with the gate electrode GE of the transistor T and the second capacitor electrode CSE2 as illustrated in FIG. 9. The conductivity (e.g., electrical conductivity) of the second sub-wiring SUL2 may be greater than that of the first sub-wiring SUL1. For example, the electrical resistance of the second sub-wiring SUL2 may be less than that of the first sub-wiring SUL1. In some embodiments, as illustrated in FIG. 10, the reference voltage wiring L_SEN may include a fourth sub-wiring SUL4 between the buffer layer BFL on the substrate SUB and the first insulating layer INS1 together with the semiconductor layer SCL of the transistor T.

The reference voltage wiring L_SEN may also have a multilayer structure including at least two of the first sub-wiring SUL1 between the third insulating layer INS3 and the fourth insulating layer INS4, the second sub-wiring SUL2 between the second insulating layer INS2 and the third insulating layer INS3, the third sub-wiring SUL3 between the first insulating layer INS1 and the second insulating layer INS2, and the fourth sub-wiring SUL4 between the substrate SUB and the first insulating layer INS1.

As described above with reference to FIGS. 7-12, the reference voltage wiring L_SEN and the first wiring AL1 may be on the non-display area NDA of the substrate SUB and may have a single layer structure or a multilayer structure. Therefore, the resistance (e.g., the electrical resistance) of the reference voltage wiring L_SEN and the first wiring AL1 can be reduced, and a drop in the alignment voltages applied during the alignment of the light emitting elements LD can be further prevented or reduced, thereby improving the alignment efficiency of the light emitting elements LD. In addition, a drop in the reference voltage applied during the driving of the display device 100 can be prevented or reduced. Thus, more accurate information about the characteristics of the pixels PXL can be obtained.

Figure 13:
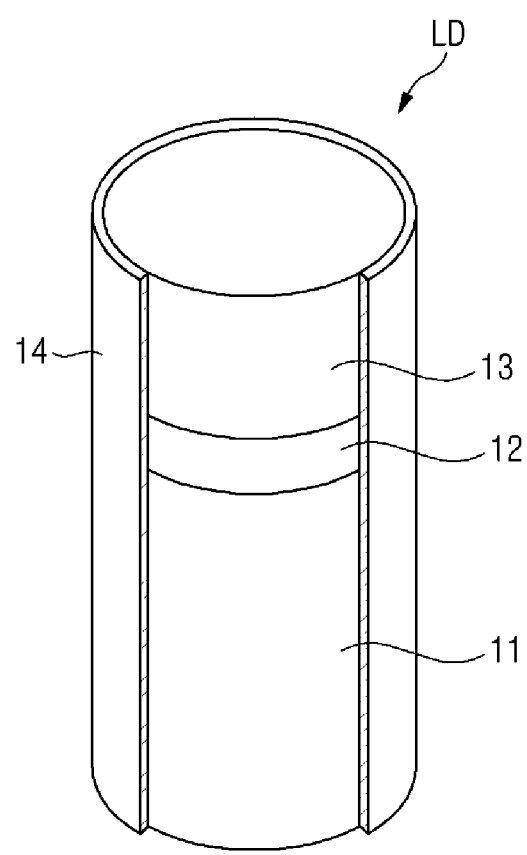
FIG. 13 is a perspective view of an example embodiment of a light emitting element included in the display device of FIG. 1.

FIG. 13 is a perspective view of an example of a light emitting element LD included in the display device 100 of FIG. 1.

Referring to FIG. 1, a light emitting element LD may include a first conductive semiconductor layer 11, a second conductive semiconductor layer 13, and an active layer 12 provided between the first conductive semiconductor layer 11 and the second conductive semiconductor layer 13. The light emitting element LD may be a sequential stack of the first conductive semiconductor layer 11, the active layer 12, and the second conductive semiconductor layer 13.

The light emitting element LD may be provided as a stick extending in a direction. If the direction in which the light emitting element LD extends is defined as a longitudinal direction, the light emitting element LD may have an end and the other end along the longitudinal direction.

One of the first conductive semiconductor layer 11 and the second conductive semiconductor layer 13 may be located at an end of the light emitting element LD, and the other one of the first conductive semiconductor layer 11 and the second conductive semiconductor layer 13 may be located at the other end of the light emitting element LD.

The light emitting element LD may be manufactured in a stick shape. Here, the term "stick shape" encompasses a rod-like shape or a bar-like shape such as a circular or polygonal column extending long in the longitudinal direction (e.g., having an aspect ratio of greater than 1), and a cross-sectional shape of the light emitting element LD is not particularly limited. For example, the length of the light emitting element LD may be greater than the diameter (or cross-sectional width) of the light emitting element LD.

The light emitting element LD may have a microscale or nanoscale size, for example, a microscale or nanoscale diameter and/or length. However, the size of the light emitting element LD is not limited to this example. For example, the size of the light emitting element LD can be variously changed according to design conditions of a light emitting display device using the light emitting element LD.

The first conductive semiconductor layer 11 may include at least one n-type semiconductor layer. For example, the first conductive semiconductor layer 11 may include any one semiconductor material selected from InAlGaN, GaN, AlGaN, InGaN, AlN and InN and may include an n-type semiconductor layer doped with a first conductive dopant such as Si, Ge or Sn. However, the constituent material of the first conductive semiconductor layer 11 is not limited to the above examples, and the first conductive semiconductor layer 11 may include various materials.

The active layer 12 may be on the first conductive semiconductor layer 11 and may have a single or multiple quantum well structure. In some embodiments, a clad layer doped with a conductive dopant may be formed on and/or under the active layer 12. For example, the clad layer may be an AlGaN layer or an InAlGaN layer. A material such as AlGaN or AlInGaN may be used to form the active layer 12, and various other materials may also be used to form the active layer 12.

When an electric field of a set or predetermined voltage or higher is applied to both ends of the light emitting element LD, the light emitting element LD emits light as electron-hole pairs combine together in the active layer 12. The light emitting element LD may be used as a light source of a pixel PXL by controlling the light emission of the light emitting element LD.

The second conductive semiconductor layer 13 may be on the active layer 12 and may include a different type (or kind) of semiconductor layer from the first conductive semiconductor layer 11. The second conductive semiconductor layer 13 may include at least one p-type semiconductor layer. For example, the second conductive semiconductor layer 13 may include at least one semiconductor material selected from InAlGaN, GaN, AlGaN, InGaN, AlN and InN and may include a p-type semiconductor layer doped with a second conductive dopant such as Mg. However, the constituent material of the second conductive semiconductor layer 13 is not limited to the above examples, and the second conductive semiconductor layer 13 may include various materials.

The light emitting element LD may further include other components in addition to the first conductive semiconductor layer 11, the active layer 12, and the second conductive semiconductor layer 13. For example, the light emitting element LD may further include one or more phosphor layers, active layers, semiconductor layers and/or electrode layers on and/or under the first conductive semiconductor layer 11, the active layer 12, and/or the second conductive semiconductor layer 13.

In addition, the light emitting element LD may further include an insulating film 14. The insulating film 14 may surround an outer circumferential surface of at least the active layer 12. In addition, the insulating film 14 may further surround at least a part of each of the first conductive semiconductor layer 11 and the second conductive semiconductor layer 13.

Although a part of the insulating film 14 is removed in FIG. 13, this is only intended to clearly show the stacked structure of the light emitting element LD, and the insulating film 14 may surround the whole of an outer circumferential surface of the light emitting element LD (e.g., sides of a cylinder) excluding both ends of the light emitting element LD. Alternatively, the insulating film 14 may cover only some of sides of the first conductive semiconductor layer 11, the active layer 12, and/or the second conductive semiconductor layer 13. Alternatively, the insulating film 14 may be omitted.

The insulating film 14 may include a transparent insulating material. For example, the insulating film 14 may include one or more insulating materials selected from $SiO_2$, $Si_3N_4$, $Al_2O_3$, and $TiO_2$. However, the material of the insulating film 14 is not limited to these examples. For example, the insulating film 14 may be made of various suitable insulating materials generally available in the art.

The insulating film 14 provided in the light emitting element LD may prevent or reduce short-circuiting of the active layer 12 of the light emitting element LD with, e.g., the above-described first pixel electrode ELT1 and second pixel electrode ELT2 (see FIG. 7). Therefore, the electrical stability of the light emitting element LD can be ensured. In addition, because surface defects of the light emitting element LD are minimized or reduced, the life and efficiency of the light emitting element LD can be improved. Further, an unwanted short circuit between the light emitting elements LD can be prevented or reduced even when the light emitting elements LD are placed close to each other.

The light emitting element LD may be used as a light source in various types (or kinds) of display devices including a light emitting display device. For example, one or more light emitting elements LD may be placed in each pixel area of a display panel to form a light emitting unit of each pixel. However, the application field of the light emitting element LD is not limited to display devices. For example, the light emitting element LD can be used in other types of light emitting devices requiring a light source, such as a lighting device.

Although the light emitting element LD is illustrated as being a cylindrical stick-shaped light emitting diode in FIG. 13, this is just an example. The type and/or shape of the light emitting element are not limited to this example.

The functions of the reference voltage wiring L_SEN during the driving of the display device 100 and during the manufacturing of the display device 100 (e.g., during the alignment process of the light emitting elements LD) will now be described.

Figure 14:
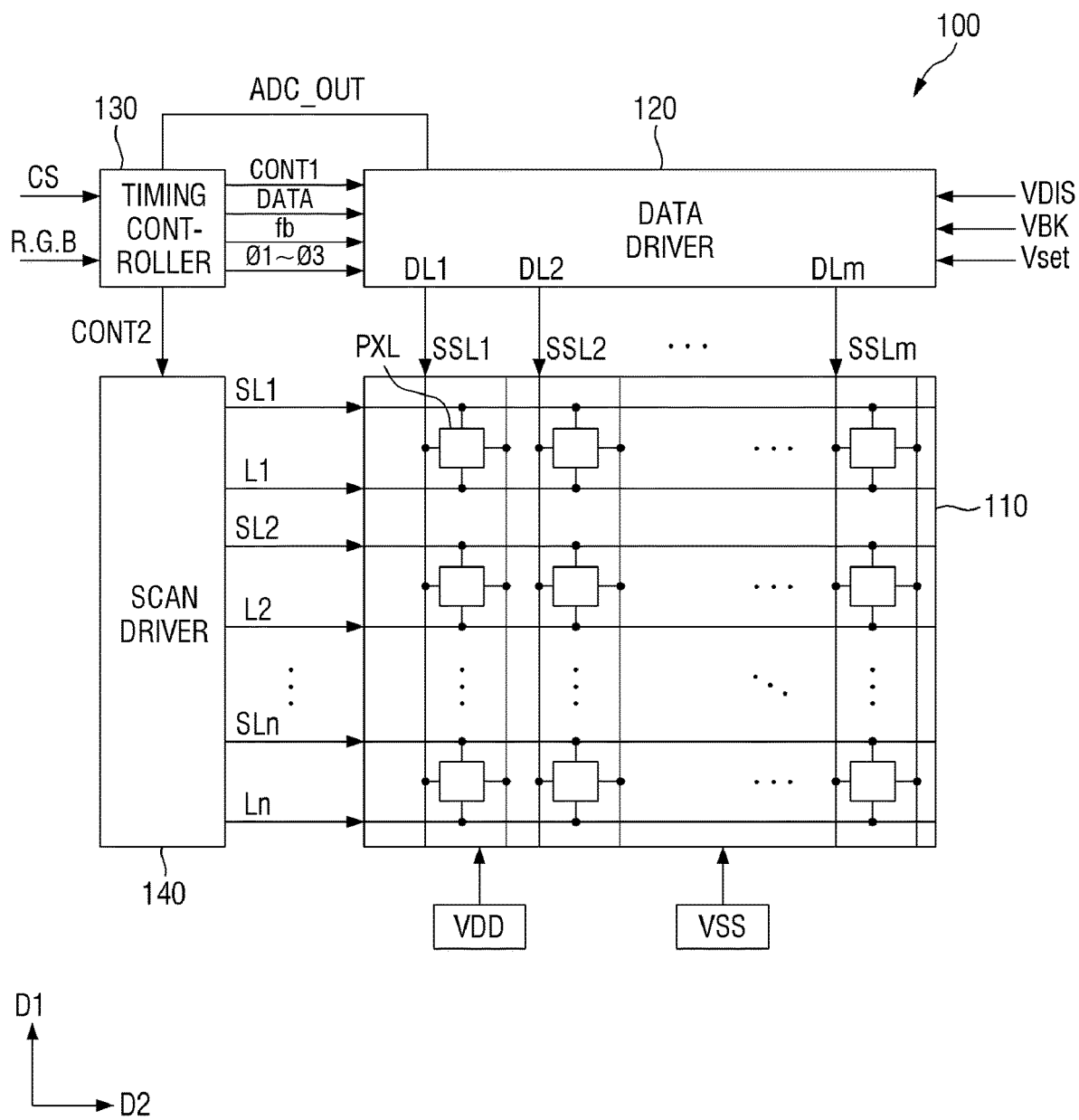
FIG. 14 is a circuit diagram of an example embodiment of the display device of FIG. 1.
Figure 16:
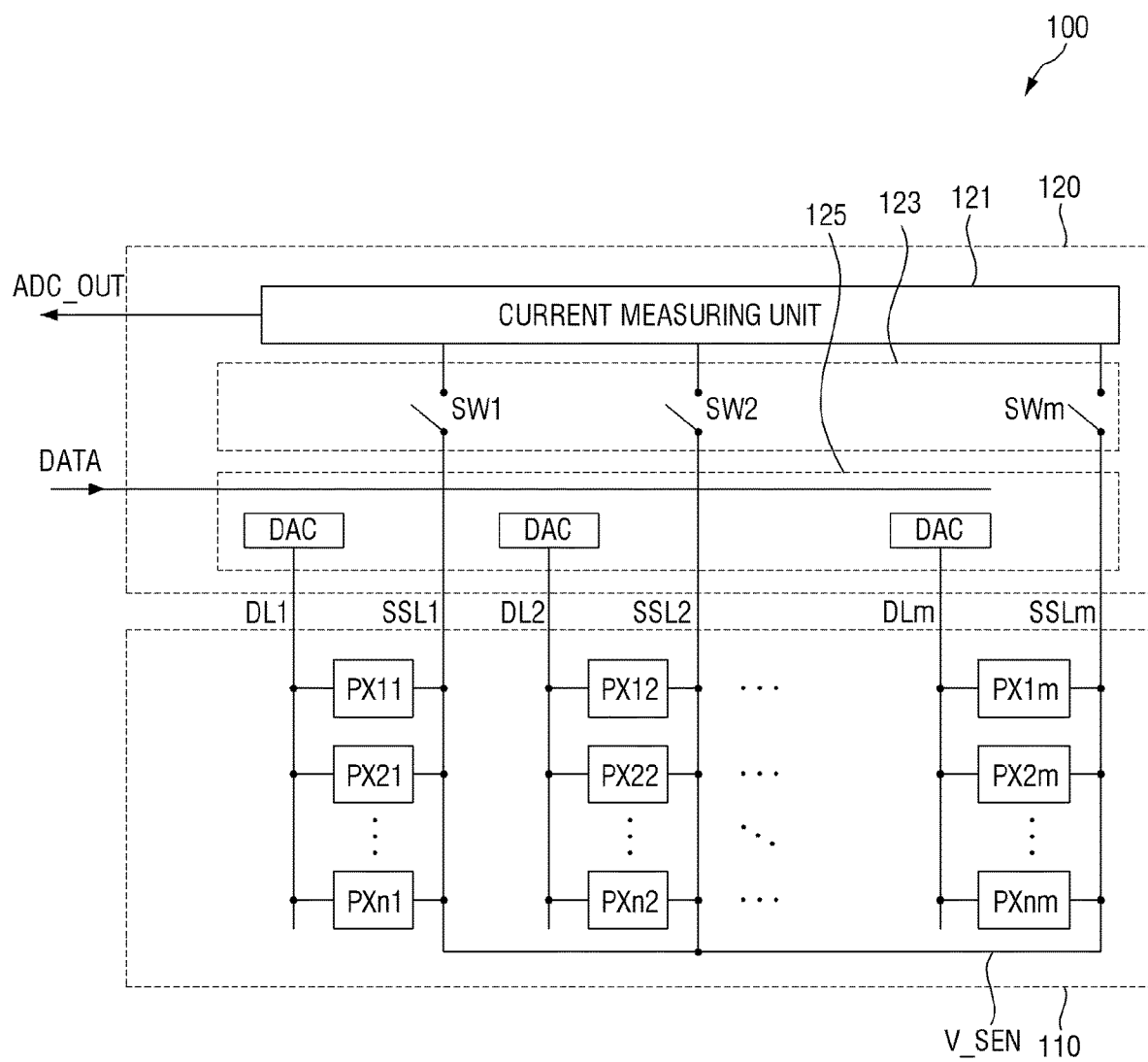
FIG. 16 illustrates an example embodiment of a data driver included in the display device of FIG. 14.
Figure 17:
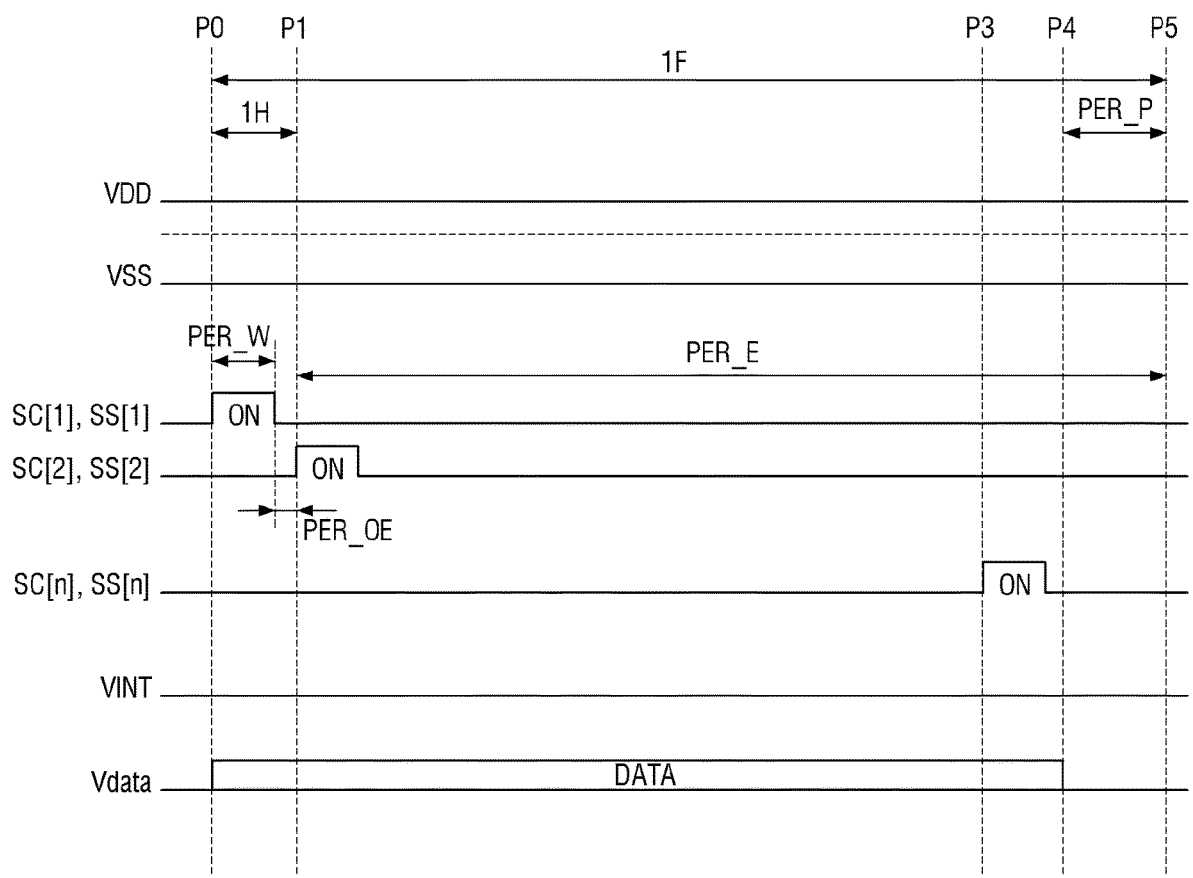
FIG. 17 is a waveform diagram of an example embodiment of signals transmitted to the pixel of FIG. 15.

FIG. 14 is a circuit diagram of an example of the display device 100 of FIG. 1. FIG. 15 is a circuit diagram of an example of a pixel PXL included in the display device 100 of FIG. 14. FIG. 16 illustrates an example of a data driver 120 included in the display device 100 of FIG. 14. FIG. 17 is a waveform diagram of an example of signals transmitted to the pixel PXL of FIG. 15.

First, referring to FIGS. 1, 2, and 14, the display device 100 may include a display panel 110, the data driver 120, a timing controller 130, a scan driver 140, and a power supply unit.

The display panel 110 may include data wirings DL1 through DLm (where m is an integer greater than 1), scan wirings SL1 through SLn (where n is an integer greater than 1), sensing wirings SSL1 through SSLm (where m is an integer greater than 1), and sensing control wirings L1 through Ln. The data wirings DL1 through DLm and the sensing wirings SSL1 through SSLm may extend in the first direction D1 and may be arranged along the second direction D2. The scan wirings SL1 through SLn and the sensing control wirings L1 through Ln may extend in the second direction D2 and may be arranged along the first direction D1. The pixels PXL may be located at intersections of the data wirings DL1 through DLm, the scan wirings SL1 through SLn, the sensing wirings SSL1 through SSLm, and the sensing control wirings L1 through Ln. Each of the pixels PXL may be coupled to one of the data wirings DL1 through DLm, one of the scan wirings SL1 through SLn, one of the sensing wirings SSL1 through SSLm, and one of the sensing control wirings L1 through Ln. In addition, each of the pixels PXL may receive a first power supply voltage VDD and a second power supply voltage VSS.

The data driver 120 may be coupled to the display panel 110 by the data wirings DL1 through DLm and the sensing wirings SSL1 through SSLm. The data driver 120 may provide data signals D1 through Dm to the pixels PXL through the data wirings DL1 through DLm under the control of the timing controller 130. The data driver 120 may also receive signals VDIS, VBK, and Vset. In addition, the data driver 120 may provide a reference voltage VINT to the pixels PXL through the sensing wirings SSL1 through SSLm and receive sensing currents from the pixels PXL through the sensing wirings SSL1 through SSLm.

The timing controller 130 may receive a control signal CS and an image signal R, G, B from an external system. The control signal CS may include a vertical synchronization signal Vsync, a horizontal synchronization signal Hsync, etc. The image signal R, G, B may include luminance information of the pixels PXL, and luminance may have 1024, 256 or 64 gray levels. The timing controller 130 may generate image data DATA by dividing the image signal R, G, B on a frame-by-frame basis according to the vertical synchronization signal Vsync and dividing the image signal R, G, B on a scan wiring-by-scan wiring basis according to the horizontal synchronization signal Hsync. The timing controller 130 may provide control signals CONT1 and CONT2 to the data driver 120 and the scan driver 140, respectively, in response to the control signal CS and the image signal R, G, B. The timing controller 130 may provide the image data DATA to the data driver 120 together with the control signal CONT1, and the data driver 120 may generate data signals by sampling and holding the input image data DATA and converting the image data DATA into analog voltages according to the control signal CONT1. Then, the data driver 120 may provide the data signals to the pixels PXL through the data wirings DL1 through DLm. The timing controller 130 may provide the data driver 120 with switching control signals φ1 through φ3 for controlling switching operations of sensing switches SW1 and SW2 through SWm (see FIG. 16) and the timing controller 130 may provide the data driver 120 with signals fb and ADC_OUT.

The scan driver 140 may be coupled to the display panel 110 by the scan wirings SL1 through SLn and the sensing control wirings L1 through Ln. The scan driver 140 may sequentially transmit scan signals to the scan wirings SL1 through SLn according to the control signal CONT2 received from the timing controller 130. The scan driver 140 may provide sensing signals to pixels PXL, whose currents need to be measured, through the sensing control wirings L1 through Ln during a sensing period.

The power supply unit may supply a driving voltage to the pixels PXL according to a control signal received from the timing controller 130. The driving voltage may include the first power supply voltage VDD and the second power supply voltage VSS, and the first power supply voltage VDD may have a greater electric potential than the second power supply voltage VSS.

Figure 15:
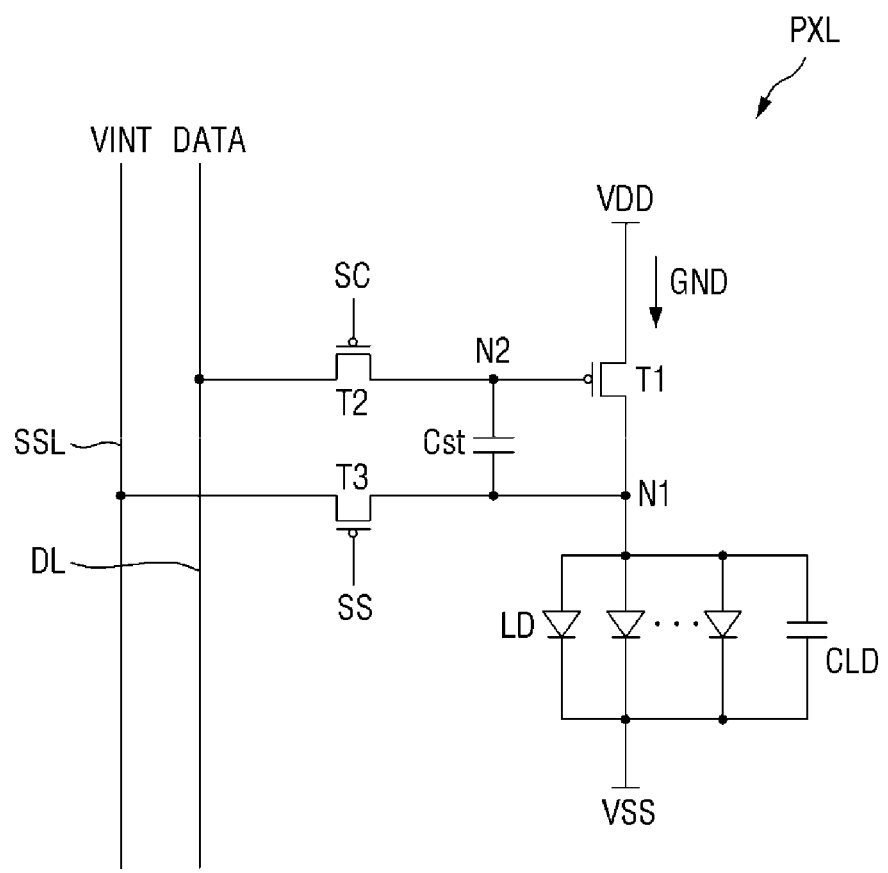
FIG. 15 is a circuit diagram of an example embodiment of a pixel included in the display device of FIG. 14.

Referring to FIG. 15, a pixel PXL may include a first transistor T1, a second transistor T2, a third transistor T3, a storage capacitor Cst, and light emitting elements LD.

The first transistor T1 may include a first electrode receiving the first power supply voltage VDD, a second electrode coupled to a first node N1, and a gate electrode (or a control electrode) coupled to a second node N2. The first transistor T1 may transmit a driving current to the first node N1 based on a voltage of the second node N2.

The second transistor T2 may include a first electrode coupled to a data line, a second electrode coupled to the second node N2, and a gate electrode receiving a scan signal SC. The second transistor T2 may provide a data signal DATA received through the data line to the second node N2 in response to the scan signal SC.

The third transistor T3 may include a first electrode coupled to a sensing wiring, a second electrode coupled to the first node N1, and a gate electrode receiving a sensing control signal SS. The third transistor T3 may provide the reference voltage VINT received through the sensing wiring to the first node N1 in response to the sensing control signal SS.

The storage capacitor Cst may be coupled between the first node N1 and the second node N2 and may store the data signal DATA or hold the data signal DATA for a set or predetermined time.

The light emitting elements LD may be coupled between the first node N1 and a second power supply wiring receiving the second power supply voltage VSS. A light emitting element capacitor CLD may be coupled between the first node N1 and the second power supply wiring for receiving the second power supply voltage VSS. The light emitting elements LD may emit light based on the driving current received through the first transistor T1.

Referring to FIGS. 14 and 16, the data driver 120 may include a current measuring unit 121, a switching unit 123, and a data providing unit 125.

The current measuring unit 121 may be coupled to pixels PX11 through PXnm by the sensing wirings SSL1 through SSLm. The current measuring unit 121 may operate as a current integrator in a sensing period. Here, the sensing period is a period of time during which a current flowing through the light emitting elements LD (see FIG. 15) is measured. A compensation value for a data signal may be determined based on measured currents. For example, the current measuring unit 121 may include an operation amplifier, a capacitor, etc. and integrate sensing currents received from at least some of the pixels PX11 through PXnm by using these components.

The current measuring unit 121 may be coupled to the sensing wirings SSL1 through SSLm via the switching unit 123. The switching unit 123 may include the switches SW1 through SWm, and the switches SW1 through SWm may couple the sensing wirings SSL1 through SSLm to the current measuring unit 121. The switches SW1 through SWm may operate independently of each other based on switching control signals received from the timing controller 130. For example, only the first switch SW1 may be turned on, in which case the current measuring unit 121 may measure the characteristics of each of the eleventh through (n1)th pixels PX11 through PXn1 included in a first pixel column through the first sensing wiring SSL1. For another example, when only the second switch SW2 is turned on, the current measuring unit 121 may measure the characteristics of each of the twelfth through (n2)th pixels PX12 through PXn2 included in a second pixel column through the second sensing wiring SSL2. For another example, when all of the first through $m^{th}$ switches SW1 through SWm are turned on, the current measuring unit 121 may measure the characteristics of all pixels included in one pixel row (e.g., a first pixel row including the eleventh through $(1m)^{th}$ pixels PX11 through PX1m) through the first through $m^{th}$ sensing wirings SSL1 through SSLm.

Because the first through $m^{th}$ sensing wirings SSL1 through SSLm are coupled to the reference voltage wiring V_SEN as described above, a drop in a sensing voltage for sensing and attenuation of sensing currents can be reduced in a method of measuring the characteristics of all pixels included in a set or specific pixel row.

The data providing unit 125 may include a plurality of digital-to-analog converters (DACs), and the DACs may receive the data signal DATA through a main data wiring, convert the data signal DATA into analog signals, and provide the analog signals to the pixels PX11 through PXnm through the data wirings DL1 through DLm.

Referring to FIGS. 15 and 17, one frame 1F may include a data write period PER_W, an emission period PER_E, and a porch period PER_P. Here, the frame 1F is a period during which one frame image is displayed. For example, the frame 1F may be a time shorter than 1/60 seconds. One frame 1F includes horizontal times corresponding to the number of pixel columns (e.g., pixel columns included in the display device 100). For example, one frame 1F may include 800 horizontal times (800H) corresponding to 800 pixel columns, and one horizontal time (1H) may be, for example, about 16 ms.

The data write period PER_W is a period of time during which the data signal DATA is provided to each pixel PXL and may be smaller than one horizontal time (1H). The data write period PER_W may be sequentially allocated to each pixel row, and the data write periods PER_W allocated to the pixel rows may be separated by a set or specific time PER_OE. For example, at a start time P0, the data write period PER_W may be allocated to a first pixel row. Then, at a first time P1, the data write period PER_W may be allocated to a second pixel row.

The emission period PER_E may be a period of time during which each pixel PXL emits light in response to the data signal DATA. The emission period PER_E may be, for example, 719 horizontal times (719H) and may extend past a third time P3. The emission period PER_E may be allocated the set or specific time PER_OE after the data write period PER_W.

The porch period PER_P may be allocated after the emission period PER_E and may be a period for distinguishing a current frame from a next frame (e.g., during a period from a fourth time P4 to a fifth time P5). The porch period PER_P may be, for example, 80 horizontal times (80H).

Each of the first power supply voltage VDD, the second power supply voltage VSS, and the reference voltage VINT may have a constant voltage level during one frame 1F.

A data voltage Vdata may change every horizontal time (1H) according to the data signal DATA and may have a voltage level between, e.g., about 1 V and 10 V.

In the data write period PER_W for the first pixel row, a first scan signal SC[1] and a first sensing control signal SS[1] may have a logic high level (or a turn-on voltage level). In this case, the second transistor T2 of a pixel PXL (see FIG. 14) may be turned on in response to the first scan signal SC[1], and a data voltage corresponding to the data signal DATA may be applied to the second node N2. In addition, the third transistor T3 may be turned on in response to the first sensing control signal SS[1], and the reference voltage VINT may be applied to the first node N1. The first transistor T1 may be turned on in response to the node voltage (e.g., the data voltage) of the second node N2 and transmit the node voltage to the first node N1. Here, because a current path (e.g., a sensing path) is formed through the third transistor T3, a driving current may move to the current measuring unit 121 (see FIG. 16) through a sensing wiring. For example, writing data to the pixel PXL and measuring the characteristics of the pixel PXL can be performed concurrently (e.g., simultaneously).

Because the data write period PER_W is sequentially allocated to each pixel row as illustrated in FIG. 17, the display device 100 may measure the characteristics of the pixels PXL on a pixel row-by-pixel row basis.

As described above with reference to FIGS. 14-17, the display device 100 may measure the characteristics of the pixels PXL using an external compensation method. The display device 100 may measure the characteristics of the pixels PXL while writing data to the pixels PXL. The reference voltage VINT for measuring the characteristics of the pixels PXL may be provided to the pixels PXL through the sensing wirings SSL1 through SSLm. Here, because the sensing wirings SSL1 through SSLm are coupled to each other by the reference voltage wiring V_SEN, a drop in the reference voltage VINT can be reduced. In addition, the attenuation of sensing currents can be reduced by the sensing wirings SSL1 through SSLm, and the characteristics of the pixels PXL can be measured more accurately.

Figure 18:
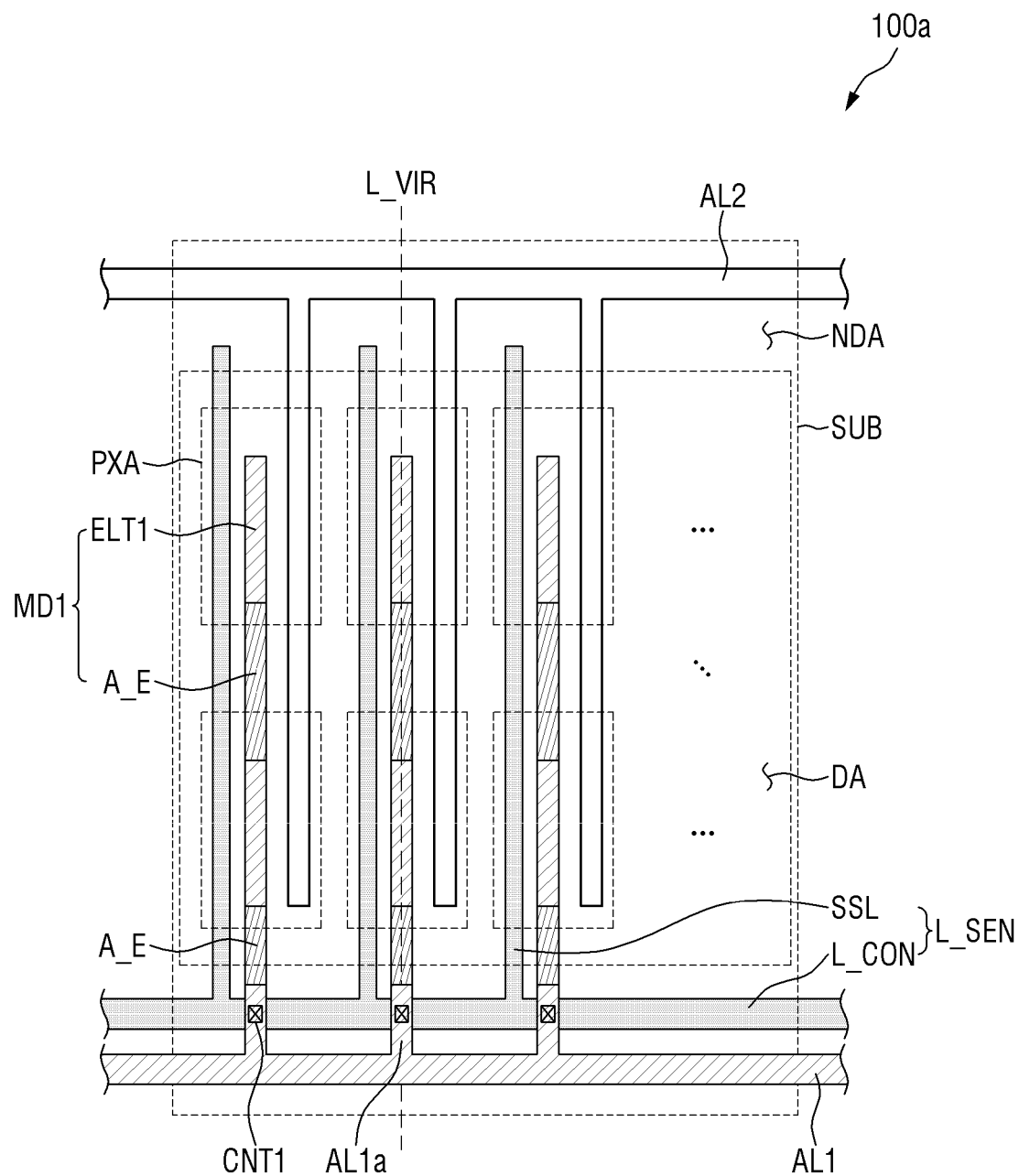
FIGS. 18-19 are plan views of an example embodiment of a display device being manufactured.
Figure 19:
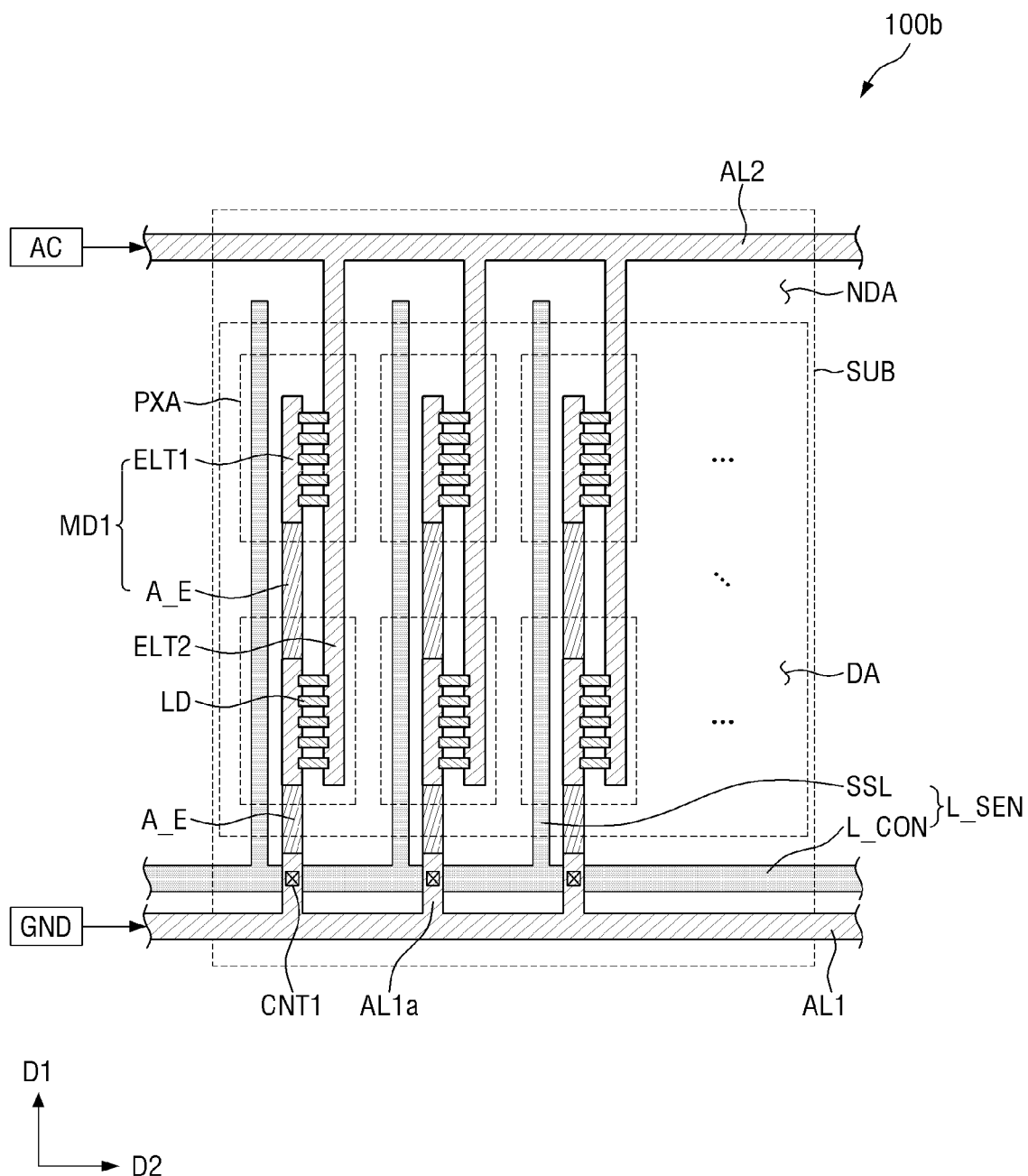
Figure 20:
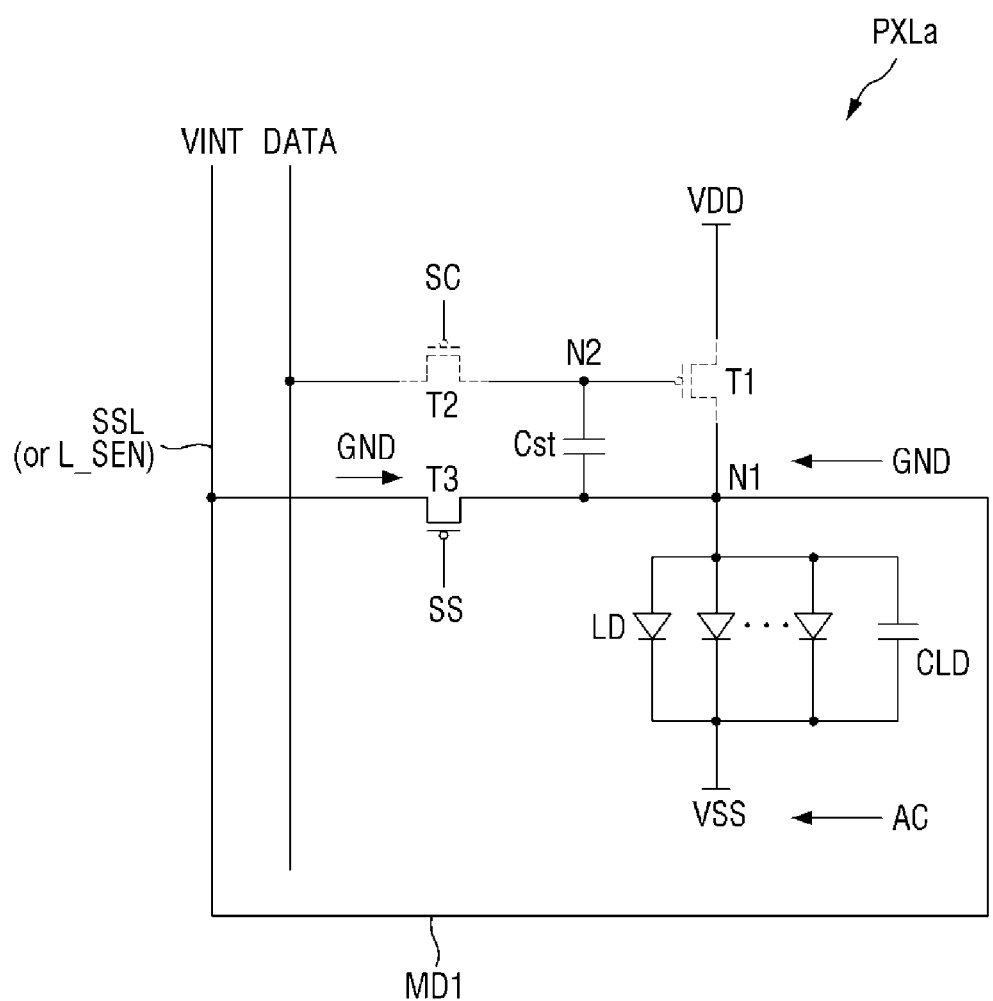
FIGS. 20-21 are circuit diagrams of example embodiments of a pixel included in a pixel area of the display device of FIG. 19.
Figure 21:
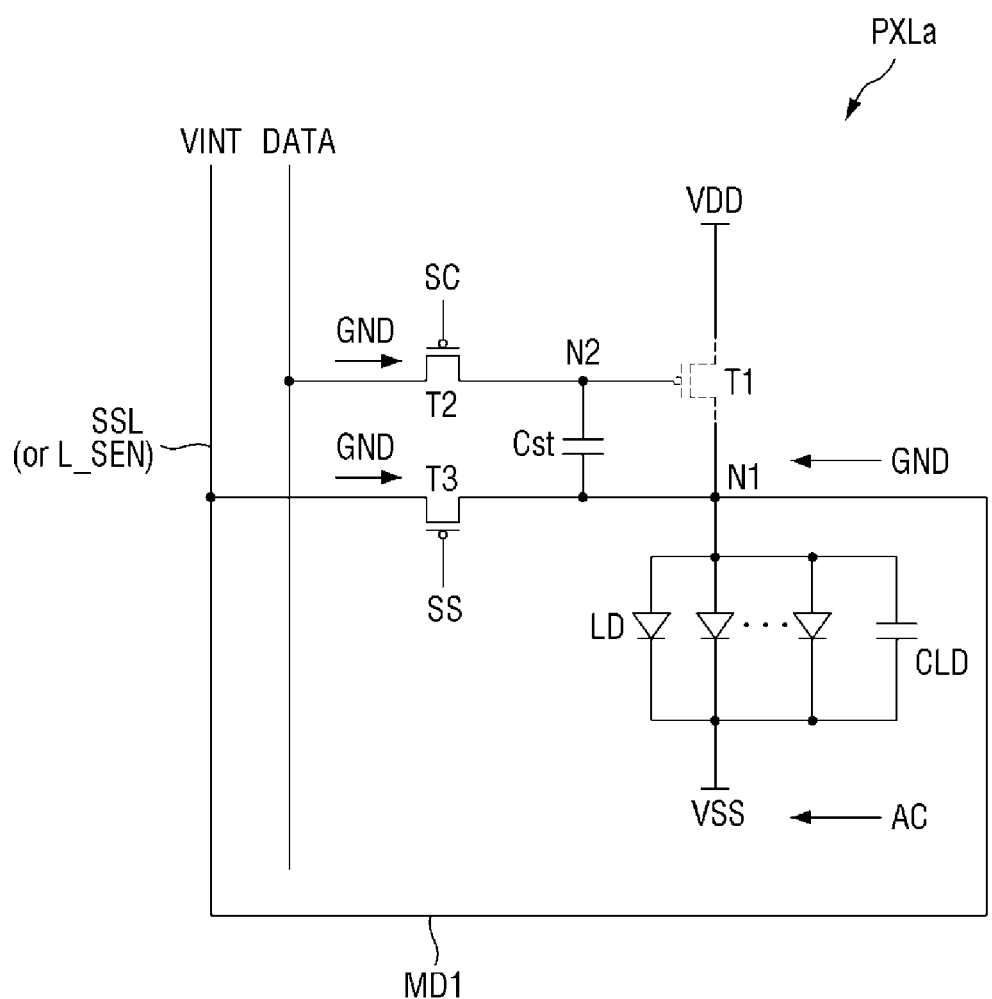
Figure 22:
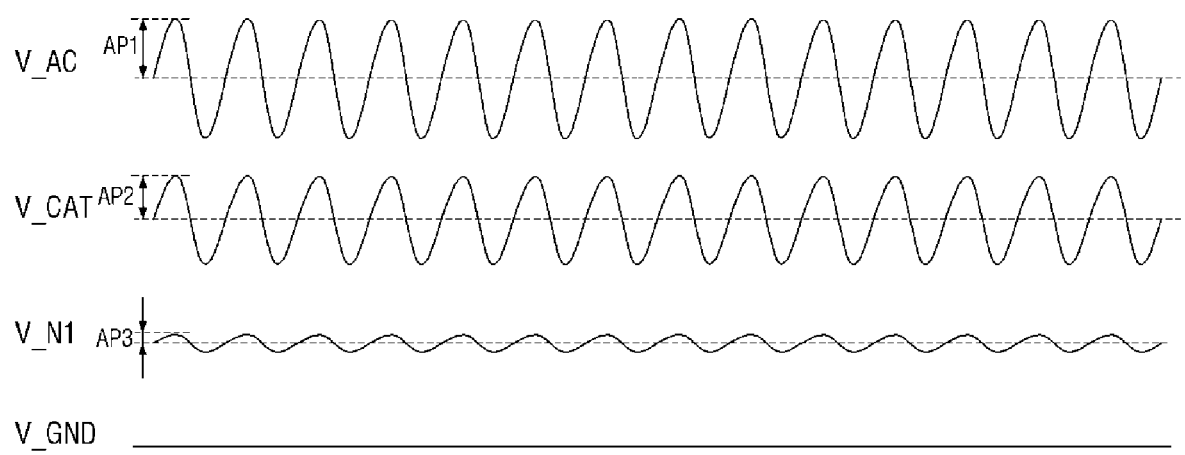
FIG. 22 is a waveform diagram of an example embodiment of signals measured in the pixel of FIG. 20.

FIGS. 18-19 are plan views of an example of a display device being manufactured. In FIGS. 18-19, plan views of a display device corresponding to the display device 100 of FIG. 2 are illustrated. FIGS. 20-21 are circuit diagrams of respective examples of a pixel PXLa included in the pixel area PXA of the display device of FIG. 19. In FIGS. 20-21, the pixel PXLa is substantially similar to the pixel PXL of FIG. 15 is illustrated. FIG. 22 is a waveform diagram of an example of signals measured in the pixel PXLa of FIG. 20.

Referring to a display device 100a of FIG. 18, a substrate SUB may be prepared. The substrate SUB may include a display area DA including pixel areas PXA and a non-display area NDA. Because the pixel areas PXA, the display area DA and the non-display area NDA are substantially the same as the pixel areas PXA, the display area DA and the non-display area NDA described above with reference to FIG. 2, their description will not be repeated.

A reference voltage wiring L_SEN may be formed in the display area DA and the non-display area NDA. A circuit element layer including various circuit elements constituting each pixel circuit PXC of FIG. 14 and/or various wirings coupled to the circuit elements may be on the substrate SUB.

As described above with reference to FIG. 2, sensing wirings SSL may extend in the first direction D1 to traverse the display area DA of the substrate SUB and may be repeatedly arranged along the second direction D2. A connecting wiring L_CON may be on the non-display area NDA of the substrate SUB to extend in the second direction D2 and may be coupled to the sensing wirings SSL. The sensing wirings SSL and the connecting wiring L_CON may be integrally formed in the same process.

Next, common electrodes MD1, second pixel electrodes ELT2, and first wiring AL1 and second wiring AL2 may be formed in the display area DA. Here, each of the common electrodes MD1 may be formed by coupling first pixel electrodes ELT1 and may include the first pixel electrodes ELT1 and coupling electrodes A_E coupling the first pixel electrodes ELT1. The common electrodes MD1 may extend in the first direction D1 to the non-display area DA located on a side of the display device 100a. Similarly, the second pixel electrodes ELT2 may extend in the first direction D1 to the non-display area NDA located on the other side of the display device 100.

The first wiring AL1 and the second wiring AL2 may be in the non-display area NDA. The first wiring AL1 and the second wiring AL2 may be located at different ends of the substrate SUB to face each other with the display area DA interposed between the first wiring AL1 and the second wiring AL2. The first wiring AL1 may be in the non-display area NDA below the display area DA, and the second wiring AL2 may be in the non-display area NDA above the display area DA. The first wiring AL may be coupled to the common electrodes MD1, and the second wiring AL2 may be coupled to the second pixel electrodes ELT2. The first wiring AL1 and the common electrodes MD1 may be integrally formed, and the second wiring AL2 and the second pixel electrodes ELT2 may be integrally formed.

The first wiring AL1 and the second wiring AL2 and the common electrodes MD1 may have a single layer structure or a multilayer structure.

Referring to FIG. 19, after the formation of the common electrodes MD1 and the second electrodes ELT2, light emitting elements LD may be supplied or placed in each light emitting area PXA. The light emitting elements LD may be dispersed within a set or predetermined solution and supplied to each pixel area PXA by, e.g., an inkjet method. However, the method of supplying the light emitting elements LD is not limited to the inkjet method, and the light emitting elements LD can be supplied to each pixel area PXA through various methods.

Next, alignment voltages may be applied to the first wiring AL1 and the second wiring AL2, and an electric field may be formed in each pixel area PXA. Accordingly, the light emitting elements LD are self-aligned between the first pixel electrode ELT1 and the second pixel electrode ELT2 in each pixel area PXA.

In some embodiments, a ground voltage GND may be applied to the first wiring AL1, and an alternating current voltage AC may be applied to the second wiring AL2. Alternatively, the alternating current voltage AC may be applied to the first wiring AL1, and the ground voltage GND may be applied to the second wiring AL2.

The voltages applied to the first wiring AL1 and the second wiring AL2 may be provided to the common electrodes MD1 and the second pixel electrodes ELT2. Accordingly, an electric field may be formed between the common electrode MD1 and the second pixel electrode ELT2 in each pixel area PXA, causing the light emitting elements LD injected into each pixel area PXA to be aligned between the first pixel electrode ELT1 and the second pixel electrode ELT2.

The supply and alignment of the light emitting elements LD may be performed sequentially or concurrently (e.g., simultaneously). For example, while the light emitting elements LD are being supplied to each pixel area PXA, they may be aligned by applying alignment voltages to the common electrode MD1 and the second pixel electrode ELT2 in each pixel area PXA. For another example, after the light emitting elements LD are supplied to each pixel area PXA, they may be aligned by applying alignment voltages to the common electrode MD1 and the second pixel electrode ELT2 in each pixel area PXA. In some embodiments, the supply and alignment of the light emitting elements LD can be performed in any order and/or method.

The first wiring AL1 may be electrically coupled to the reference voltage wiring L_SEN through first contact holes CNT1. Therefore, a drop in the alignment voltages can be further reduced, and the alignment efficiency of the light emitting elements LD can be improved.

Referring to FIG. 20, because the common electrodes MD1 are coupled to the reference voltage wiring L_SEN, the ground voltage GND applied to the first wiring AL1 during the alignment of the light emitting elements LD may be applied to the reference voltage wiring L_SEN through the common electrodes MD1. Here, when a third transistor T3 is turned on in response to a sensing control signal SS, a first node N1 may be electrically coupled to the reference voltage wiring L_SEN. The sensing control signal SS may be provided by the scan driver 140 described above with reference to FIG. 14.

Referring to a display device 100b of FIG. 19, because the common electrodes MD1 and the second pixel electrodes ELT2 are adjacent to each other, they can be coupled to each other. Accordingly, as illustrated in FIG. 22, a node voltage V_N1 at the first node N1 may have a waveform of an alternating current, not a waveform of a constant voltage such as a ground voltage V_GND. The longer the path from a point where the ground voltage V_GND is applied to the first node N1, the larger the resistance component of the path, which, in turn, increases third amplitude AP3 of the node voltage V_N1. Because the path from the point where the ground voltage V_GND is applied to the first node N1 is formed by parallel coupling of each common electrode MD1 and the reference voltage wiring L_SEN, the resistance component of the path can be reduced, and the amplitude AP3 of the node voltage V_N1 can be reduced.

An alternating current voltage V_AC applied through the second wiring AL2 may be dropped by the resistance component of each of the second pixel electrodes ELT2, and an electrode voltage V_CAT at each of the second pixel electrodes ELT2 may have second amplitude AP2 smaller than first amplitude AP1 of the alternating current voltage V_AC.

The larger the difference between the electrode voltage V_CAT and the node voltage V_N1, the greater the electric field formed between the common electrode MD1 and the second pixel electrode ELT2 in each pixel area PXA. Accordingly, the alignment effect of the light emitting elements LD can be improved.

In embodiments, during the alignment of the light emitting elements LD, the ground voltage GND may be applied to a data wiring DL, and a scan signal SC having a turn-on voltage may be applied to a second transistor T2.

Referring to FIG. 21, when the second transistor T2 is turned on in response to the scan signal SC, it may be electrically coupled to the data wiring DL. In addition, the data wiring DL and the first node N1 (e.g., the common electrode MD1 and the reference voltage wiring L_SEN) may be coupled to each other by a storage capacitor Cst. When a data signal DATA having the ground voltage GND is transmitted, the variation in the node voltage may be reduced by the storage capacitor Cst.

TABLE 1

| | Amplitude | Conditions | | | |
|---|---|---|---|---|---|
| | (AP1) of AC voltage | Comparative | T2 ON | T3 ON | T2, T3 ON |
| ΔV | 20 [V] | 5[V] | 9.7 [V] | 12.3 [V] | 17.3 [V] |
| Uniformity | — | 20% | 49% | 62% | 87% |

Table 1 shows a potential difference ΔV between the common electrode MD1 and the second electrode ELT2 in each pixel area PXA (e.g., a difference between the second amplitude AP2 of the electrode voltage V_CAT and the third amplitude AP3 of the node voltage V_N1) according to the turn-on state or turn-off state of each of the second transistor T2 and the third transistor T3.

When the second transistor T2 and the third transistor T3 are turned off, the potential difference ΔV is about 20% of the alternating current voltage AC. When the second transistor T2 is turned on (for example, when the storage capacitor Cst is used), the potential difference ΔV increases to about 49% of the alternating current voltage AC. When the third transistor T3 is turned on (for example, when the reference voltage wiring L_SEN is used), the potential difference ΔV increases to about 62% of the alternating current voltage AC. When the second transistor T2 and the third transistor T3 are turned on, the potential difference ΔV increases to about 87% of the alternating current voltage AC. For example, the alignment efficiency can be improved up to about four times by turning on the second transistor T2 and the third transistor T3 during the alignment of the light emitting elements LD.

Referring again to FIG. 19, after the supply and alignment of the light emitting elements LD are completed, the first pixel electrodes ELT1 are separated from each other between the pixel areas PXA so that pixels PXL can be driven independently. For example, the connecting electrodes A_E of each common electrode MD1 may be removed using, e.g., an etching process to form the first pixel electrodes ELT1. Here, the connecting electrodes A_E may be portions of each common electrode MD1 which are located between a pixel area PXA and another pixel area PXA and between a pixel area PXA and the first wiring AL1.

On the other hand, each of the second pixel electrodes ELT2 may remain intact without being divided between the pixel areas PXA. In addition, the second wiring AL2 may remain coupled to the pixels PXL of the display area DA. However, embodiments are not limited to this case. For example, in an embodiment, each of the second pixel electrodes ELT2 may be divided between the pixel areas PXA.

Next, in some embodiments, both ends of each of the light emitting elements LD are physically and/or electrically coupled to the first pixel electrode ELT1 and the second pixel electrode ELT2, respectively, by forming the first contact electrode CNE1 and the second contact electrode CNE2 at respective ends of each of the light emitting elements LD, as illustrated in FIG. 7. The process of forming the first contact electrode CNE1 and the second contact electrode CNE2 can be performed before the process of forming the first pixel electrodes ELT1.

As described above with reference to FIGS. 18-22, during the alignment of the light emitting elements LD, the third transistor T3 in each pixel PXL may be turned on, the data signal DATA of the ground voltage GND may be transmitted, and the second transistor T2 may be turned on, thereby greatly improving the alignment efficiency of the light emitting elements LD.

Figure 23:
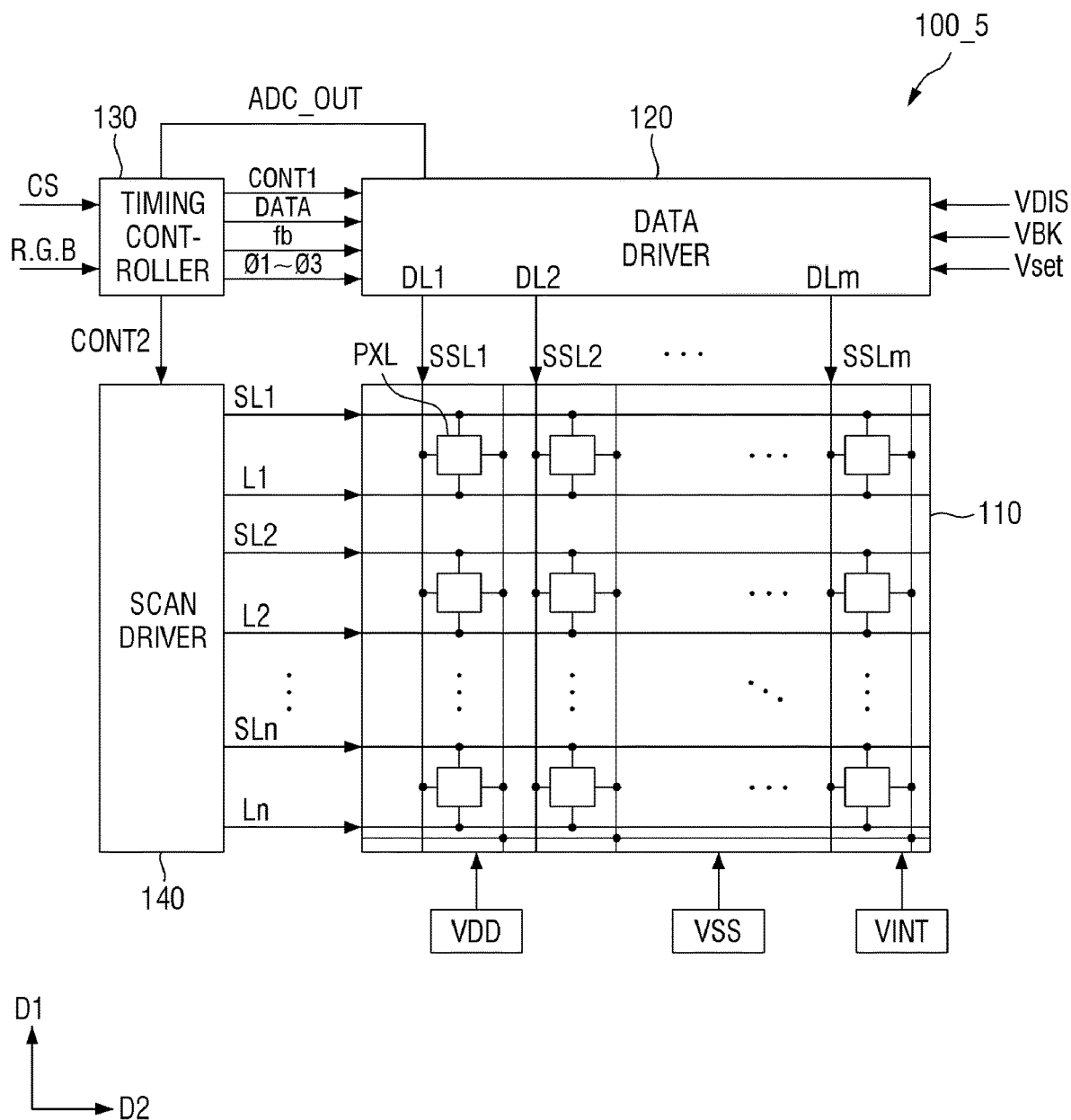
FIGS. 23-24 are circuit diagrams of example embodiments of the display device of FIG. 1.
Figure 24:
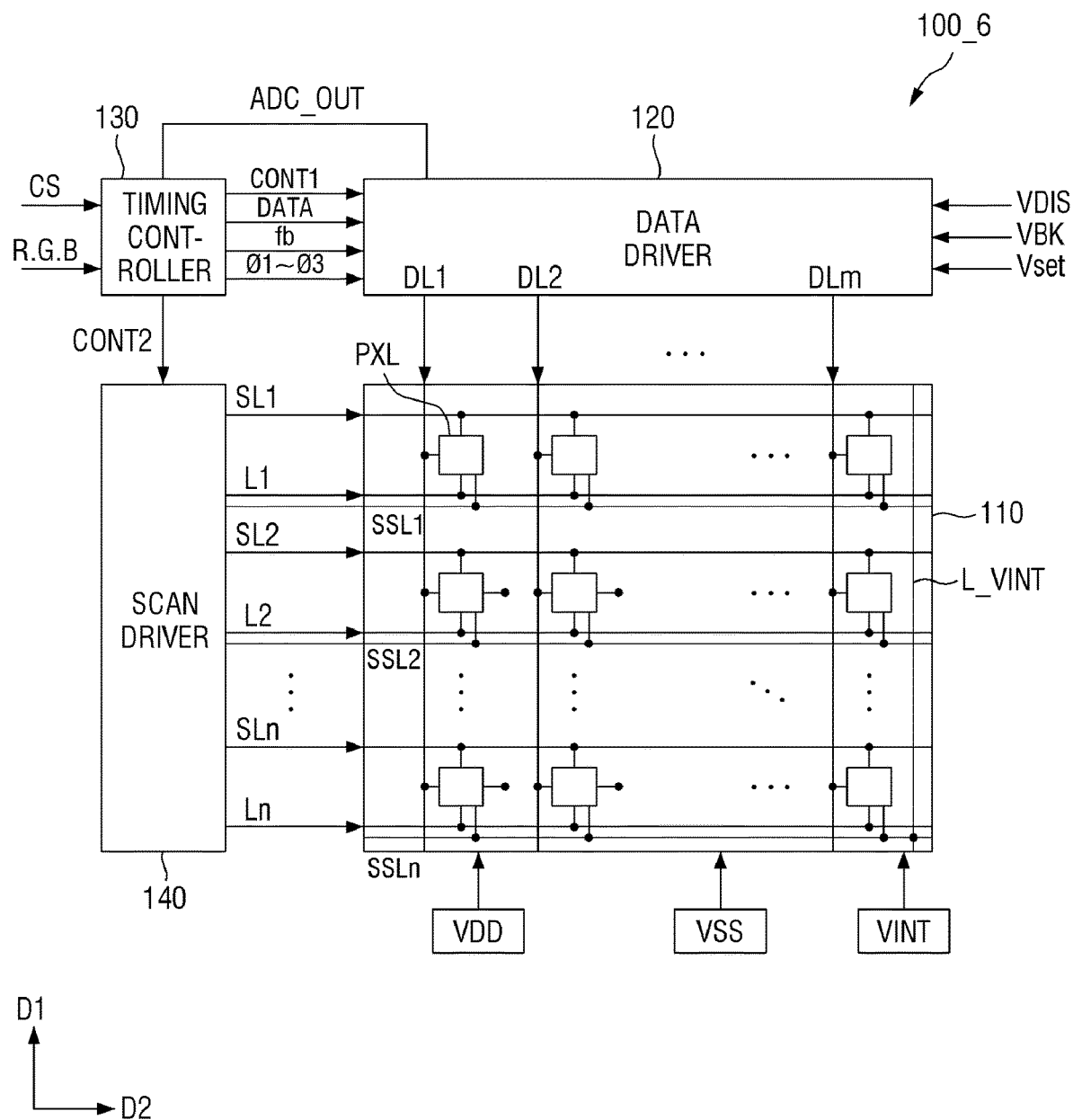
Figure 25:
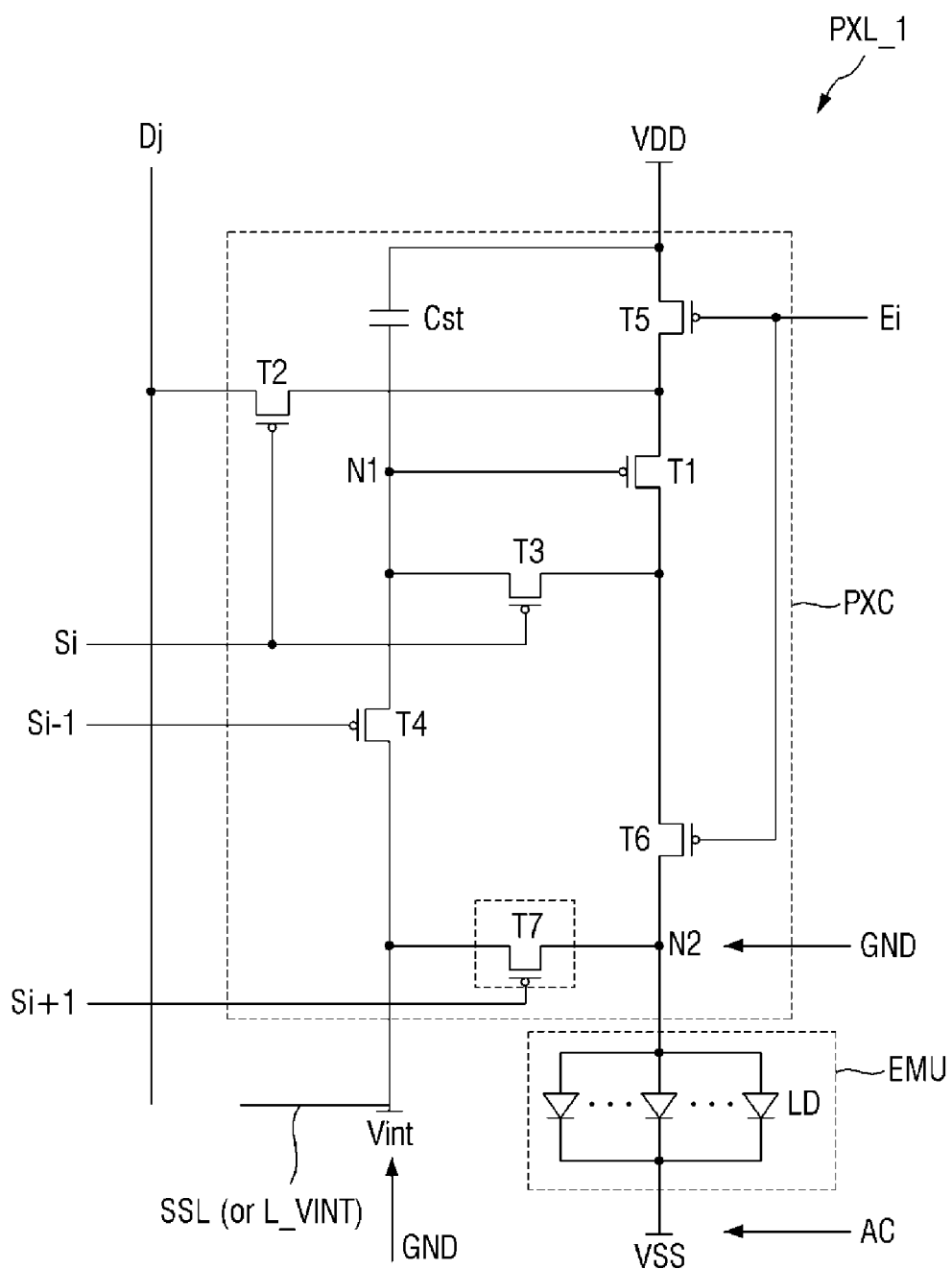
FIG. 25 is a circuit diagram of an example embodiment of a pixel included in the display device of FIG. 23.
Figure 26:
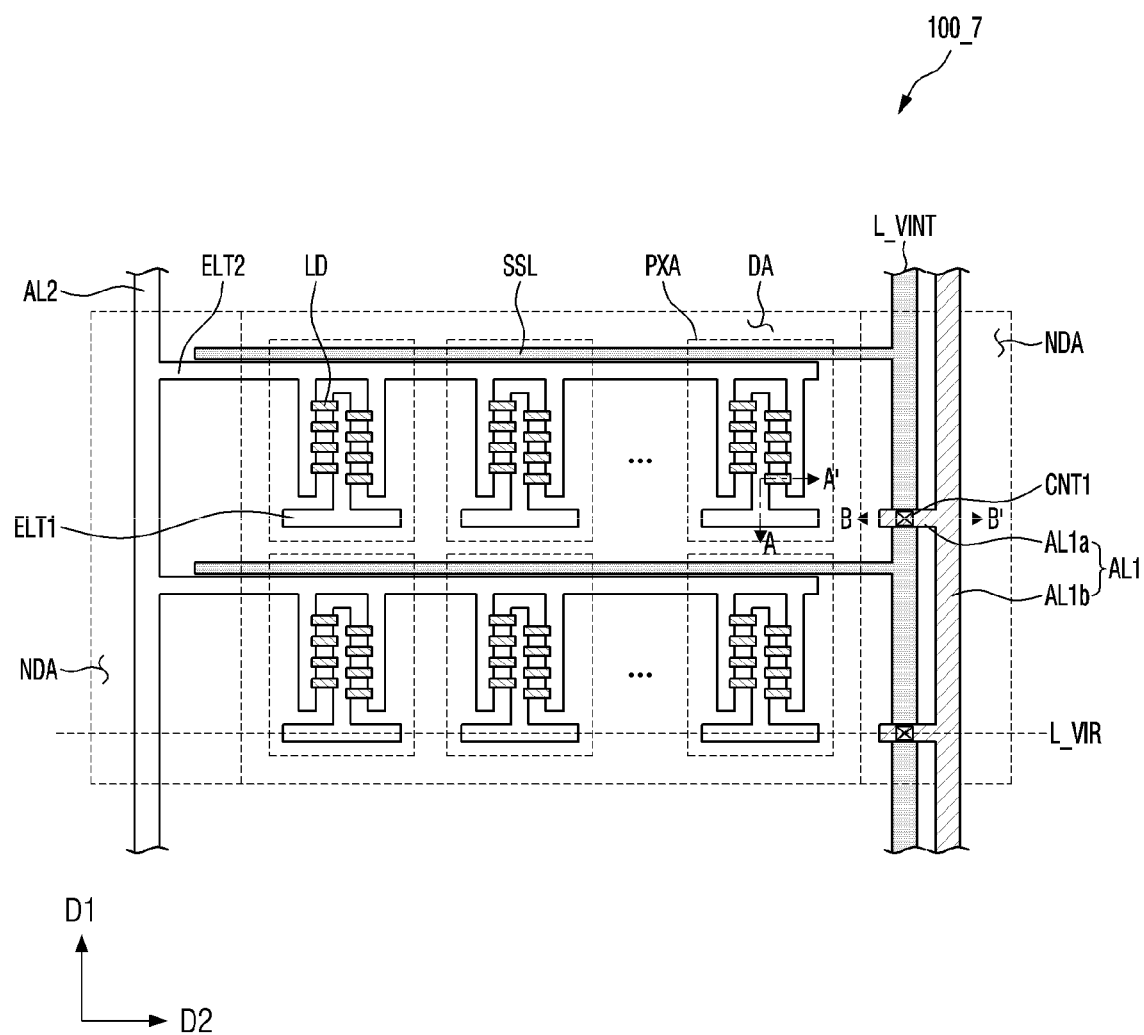
FIG. 26 is a plan view of an example embodiment of the display device of FIG. 24.

FIGS. 23-24 are circuit diagrams of examples of the display device 100 of FIG. 1. In FIGS. 23-24, circuit diagrams corresponding to FIG. 14 are illustrated. FIG. 25 is a circuit diagram of an example of a pixel PXL included in a display device 100_5 of FIG. 23. FIG. 26 is a plan view of an example of a display device 100_6 of FIG. 24.

First, referring to FIGS. 1, 14, and 23, the display device 100_5 of FIG. 23 may be substantially the same or similar to the display device 100 of FIG. 14 except for sensing wirings SSL1 through SSLm. Therefore, a redundant description thereof will not be repeated here.

The sensing wirings SSL1 through SSLm may extend in the first direction D1 to traverse a display panel 110 and may be spaced apart from each other along the second direction D2. The sensing wirings SSL1 through SSLm may be electrically coupled to each other by a reference voltage wiring at an end of the display panel 110 (e.g., in a non-display area NDA described above). In some embodiments, the sensing wirings SSL1 through SSLm may not be coupled to a data driver 120 and may be coupled to a power supply unit, and a reference voltage VINT may be applied from the power supply unit to the sensing wirings SSL1 through SSLm.

Although the sensing wirings SSL1 through SSLm extend in the first direction D1 in FIG. 23, embodiments are not limited to this case.

Referring to FIG. 24, sensing wrings SSL1 through SSLn may extend in the second direction D2 and may be spaced apart from each other along the first direction D1. In addition, the sensing wirings SSL1 through SSLn may be electrically coupled to each other by a reference voltage wiring and may receive a reference voltage VINT from the power supply unit.

Referring to FIG. 25, a pixel PXL_1 may include a light emitting unit EMU for generating light of a luminance corresponding to a data signal and a pixel circuit PXC for driving the light emitting unit EMU.

The light emitting unit EMU may include light emitting elements LD coupled in parallel between a first power supply voltage VDD and a second power supply voltage VSS (or a first power supply terminal and a second power supply terminal). Here, the first power supply voltage VDD and the second power supply voltage VSS may have different electric potentials so that the light emitting elements LD can emit light. For example, the first power supply voltage VDD may be set to a high potential power supply voltage, and the second power supply voltage VSS may be set to a low potential power supply voltage. A potential difference between the first power supply voltage VDD and the second power supply voltage VSS during an emission period of the pixel PXL may be set to be equal to or higher than a threshold voltage of the light emitting elements LD.

The light emitting unit EMU may emit light of a luminance corresponding to a driving current supplied through the pixel circuit PXC.

The pixel circuit PXC may be coupled to a scan line Si and a data line Dj of the pixel PXL. For example, when the pixel PXL is in an $n^{th}$ row and a $j^{th}$ column of a display area DA, the pixel circuit PXC of the pixel PXL may be coupled to an $i^{th}$ scan line Si and a $j^{th}$ data line Dj of the display area DA.

In addition, the pixel circuit PXC may be further coupled to at least one other scan line. For example, each of the pixels PXL in the $i^{th}$ row may be further coupled to an $(i-1)^{th}$ scan line Si-1 and/or an $(i+1)^{th}$ scan line Si+1 (or an $i^{th}$ sensing control wiring SLi). In addition, the pixel circuit PXC may be further coupled to a third power source in addition to the first power supply voltage VDD and the second power supply voltage VSS. For example, the pixel circuit PXC may also be coupled to the reference voltage VINT (or a reference power source or an initialization power source).

The pixel circuit PXC may include first through seventh transistors T1 through T7 and a storage capacitor Cst.

The first transistor T1 (a driving transistor) may have an electrode, for example, a source electrode coupled to the first power supply voltage VDD via the fifth transistor T5 and the other electrode, for example, a drain electrode coupled to respective ends of the light emitting elements LD via the sixth transistor T6. In addition, a gate electrode of the first transistor T1 may be coupled to a first node N1. The first transistor T1 controls a driving current, which flows between the first power supply voltage VDD and the second power supply voltage via the light emitting elements LD, according to a voltage of the first node N1.

The second transistor T2 (a switching transistor) is coupled between the data line Dj and the source electrode of the first transistor T1. In addition, a gate electrode of the second transistor T2 is coupled to the scan line Si. The second transistor T2 is turned on when receiving a scan signal of a gate-on voltage (e.g., a low voltage) from the scan line Si and electrically couples the data line Dj to the source electrode of the first transistor T1. Therefore, when the second transistor T2 is turned on, a data signal supplied from the data line Dj is transmitted to the first transistor T1.

The third transistor T3 is coupled between the drain electrode of the first transistor T1 and the first node N1. In addition, a gate electrode of the third transistor T3 is coupled to the scan line Si. The third transistor T3 is turned on when receiving the scan signal of the gate-on voltage from the scan line Si and electrically couples the drain electrode of the first transistor T1 to the first node N1. Therefore, when the third transistor T3 is turned on, the first transistor T1 is diode-coupled.

The fourth transistor T4 is coupled between the first node N1 and the reference voltage VINT. In addition, a gate electrode of the fourth transistor T4 is coupled to a previous scan line, for example, the $(i-1)^{th}$ scan line Si-1. The fourth transistor T4 is turned on when a scan signal of a gate-on voltage is supplied to the $(i-1)^{th}$ scan line Si-1 and transmits the voltage of the reference voltage VINT to the first node N1. Here, the reference voltage VINT may have a voltage equal to or lower than a lowest voltage of the data signal.

The fifth transistor T5 is coupled between the first power supply voltage VDD and the first transistor T1. In addition, a gate electrode of the fifth transistor T5 is coupled to a corresponding emission control line, for example, an $i^{th}$ emission control line Ei. The fifth transistor T5 is turned off when an emission control signal of a gate-off voltage is supplied to the emission control line Ei and is turned on in other cases.

The sixth transistor T6 is coupled between the first transistor T1 and the respective ends of the light emitting elements LD. In addition, a gate electrode of the sixth transistor T6 is coupled to a corresponding emission control line, for example, the $i^{th}$ emission control line Ei. The sixth transistor T6 is turned off when the emission control signal of the gate-off voltage is supplied to the emission control line Ei and is turned on in other cases.

The seventh transistor T7 is coupled between the respective ends of the light emitting elements LD and the reference voltage VINT. In addition, a gate electrode of the seventh transistor T7 is coupled to any one of the next scan lines, for example, the $(i+1)^{th}$ scan lien Si+1 (or the $i^{th}$ sensing control line SLi). The seventh transistor T7 is turned on when a scan signal of a gate-on voltage is supplied to the $(i+1)^{th}$ scan line Si+1 (or the $i^{th}$ sensing control wiring SLi) and supplies the reference voltage VINT to the respective ends of the light emitting elements LD.

The storage capacitor Cst is coupled between the first power supply voltage VDD and the first node N1. The storage capacitor Cst stores a data signal supplied to the first node N1 during each frame period and a voltage corresponding to a threshold voltage of the first transistor T1.

In FIG. 25, transistors included in the pixel circuit PXC, for example, the first through seventh transistors T1 through T7 are all illustrated as p-type transistors. However, embodiments are not limited to this case. For example, at least one of the first through seventh transistors T1 through T7 can be changed to an n-type transistor.

Referring to FIG. 26, a display device 100_7 may include sensing wirings SSL, a reference voltage wiring L_VINT, a first pixel electrode ELT1 and a second pixel electrode ELT2, and the first wiring AL1 and the second wiring AL2.

As described above with reference to FIG. 24, the sensing wirings SSL may extend in the second direction D2 and traverse pixel areas PXA in a display area DA.

The reference voltage wiring L_VINT may extend in a non-display area NDA in the first direction D1 and may be coupled to the sensing wirings SSL.

The first pixel electrode ELT1 may include a coupling portion extending in the second direction D2 in each pixel area PXA and a branch portion extending from the coupling portion in the first direction D1.

The second pixel electrode ELT2 may be located opposite to the first pixel electrode ELT1 in each pixel area PXA. The second pixel electrode ELT2 in each pixel area PXA may include a coupling portion extending to a neighboring pixel area PXA in the second direction D2 and branch portions extending from the coupling portion in the first direction D1. The branch portions of the second pixel electrode ELT2 may face the branch portion of the first pixel electrode ELT1. Light emitting elements LD may be between the branch portions of the second pixel electrode ELT2 and the branch portion of the first pixel electrode ELT2 in each pixel area PXA.

The first wiring AL1 may be in the non-display area NDA on a side of the display device 100_7 where the reference voltage wiring L_VINT is located and may be directly coupled to the reference voltage wiring L_VINT. The second wiring AL2 may be located opposite to the first wiring AL1 with respect to the display area DA and may be in the non-display area NDA on the other side of the display device 100_7.

The first wiring AL1 may include a body portion AL1a extending in the first direction D1 and protruding portions AL1b protruding from the body portion AL1a in the second direction D2. As described above with reference to FIG. 2, the first pixel electrodes ELT1 may be located on an extension line L_VIR extending in a direction in which the protruding portions AL1b protrude.

The first wiring AL1 may be coupled to the reference voltage wiring L_VINT by the protruding portions AL1b as illustrated in FIG. 26 or may be coupled to the reference voltage wiring L_VINT by the body portion AL1a as described above with reference to FIGS. 3-6.

Referring again to FIG. 25, in the process of aligning the light emitting elements LD in the pixel PXL, the first pixel electrode ELT1 and the second pixel electrode ELT2 of the light emitting unit EMU may be coupled to the first wiring AL1 and the second wiring AL2. Here, an alternating current voltage AC may be applied to the first wiring AL1 (e.g., the second power supply voltage VSS coupled to the first wiring AL1), and a ground voltage GND may be applied to the second wiring AL2 (e.g., a second node N2 coupled to the second wiring AL2). In addition, the ground voltage GND may be applied to a reference voltage wiring L_VINT (or a sensing wiring SSL) coupled to the first wiring AL1, and the seventh transistor T7 may be turned on to supplement or strengthen the ground voltage GND applied to the second node N2.

When voltages of different levels are applied to the first wiring AL1 and the second wiring AL2, an electric field is formed between the first pixel electrode ELT1 and the second pixel electrode ELT2, causing the light emitting elements LD to be aligned between the first pixel electrode ELT1 and the second pixel electrode ELT2.

As described above with reference to FIGS. 23-26, each of the display devices 100_5, 100_6 and 100_7 includes the reference voltage wiring L_VINT coupled to the first wiring AL1 and applies the ground voltage GND to each first pixel electrode ELT1 (or the second node N2 of the pixel PXL_1 of FIG. 25) through the first wiring AL1 and the reference voltage wiring L_VINT. Therefore, the alignment efficiency of the light emitting elements LD can be improved.

In a display device according to embodiments, a first wiring coupled to a pixel electrode is coupled to a reference voltage wiring coupled to the pixel electrode. Therefore, a drop in a voltage applied to the pixel electrode is reduced, and alignment efficiency of light emitting elements can be improved.

However, the effects of the embodiments of the present disclosure are not restricted to the ones set forth herein. The above and other effects of the embodiments will become more apparent to one of ordinary skill in the art to which the embodiments pertain by referencing the claims.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s)

as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display devices and/or any other relevant devices or components according to embodiments of the present disclosure described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Although the embodiments of the present disclosure have been disclosed for illustrative purposes, those skilled in the art will appreciate that various modifications, additions and substitutions are possible, without departing from the scope and spirit of the appended claims, and equivalents thereof.

What is claimed is:

1. A display device comprising:
    a substrate comprising a display area having a plurality of pixel areas and a non-display area located around the display area;
    a circuit element layer comprising a circuit element in each of the pixel areas and a reference voltage wiring in the non-display area, the reference voltage wiring being electrically coupled to the circuit element; and
    a display element layer comprising a first pixel electrode on the circuit element layer in each of the pixel areas, a second pixel electrode located opposite to the first pixel electrode, a plurality of light emitting elements between the first pixel electrode and the second pixel electrode, and a first wiring on the circuit element layer in the non-display area,
    wherein the first wiring is directly coupled to the reference voltage wiring in the non-display area,
    wherein the first wiring comprises:
    a body portion that extends in a first direction; and
    a protruding portion that protrudes from the body portion in a second direction intersecting the first direction, and
    wherein the protruding portion overlaps the reference voltage wiring, and the first wiring is coupled to the reference voltage wiring by the protruding portion.

2. The display device of claim 1, wherein the display element layer is on the circuit element layer in the non-display area and further comprises a second wiring coupled to the second pixel electrode.

3. The display device of claim 2, wherein the reference voltage wiring comprises:
    a main wiring that extends in a first direction in the non-display area; and sub-wirings that extend in a second direction intersecting the first direction, that traverse the display area, and that are spaced apart from each other along the first direction,
wherein the main wiring is directly coupled to the first wiring.

4. The display device of claim 2, wherein the first wiring is adjacent to a first side of the display area, the second wiring is adjacent to a second side opposite to the first side of the display area, and the reference voltage wiring is adjacent to the first side of the display area.

5. The display device of claim 4, wherein the first wiring overlaps the reference voltage wiring.

6. The display device of claim 1, wherein the first pixel electrode is located on an extension line of the protruding portion.

7. The display device of claim 1, wherein the first pixel electrode and the first wiring are formed by separating one common wiring.

8. The display device of claim 1, wherein the circuit element layer further comprises a first insulating layer, a second insulating layer, a third insulating layer, and a fourth insulating layer stacked sequentially between the substrate and the display element layer.

9. The display device of claim 8, wherein the reference voltage wiring comprises at least one selected from a first sub-wiring between the third insulating layer and the fourth insulating layer, a second sub-wiring between the second insulating layer and the third insulating layer, a third sub-wiring between the first insulating layer and the second insulating layer, and a fourth sub-wiring between the substrate and the first insulating layer.

10. The display device of claim 8, wherein the first wiring comprises:
    a first sub-wiring on the circuit element layer and directly coupled to the reference voltage wiring; and
    a second sub-wiring on the first sub-wiring,
    wherein the conductivity of the second sub-wiring is greater than that of the first sub-wiring.

11. The display device of claim 1, wherein the circuit element comprises a transistor, and the transistor comprises:
    a semiconductor pattern between the substrate and a first insulating layer;
    a gate electrode between the first insulating layer and a second insulating layer, the gate electrode overlapping the semiconductor pattern; and
    a first electrode between a third insulating layer and a fourth insulting layer, the first electrode being electrically coupled to the semiconductor pattern.

12. The display device of claim 11, wherein the first electrode of the transistor is coupled to the first pixel electrode, and a second electrode of the transistor is electrically coupled to the reference voltage wiring.

13. The display device of claim 1, wherein the first pixel electrode is on the same layer as the second pixel electrode and spaced apart from the second pixel electrode, a first end of each of the light emitting elements is electrically coupled to the first pixel electrode, and a second end of each of the light emitting elements is electrically coupled to the second pixel electrode.

14. The display device of claim 13, wherein the display element layer further comprises:
    first contact electrodes on the respective first ends of the light emitting elements, the first contact electrodes respectively coupling the light emitting elements to the first pixel electrode; and
    second contact electrodes on the respective second ends of the light emitting elements, the second contact electrodes respectively coupling the light emitting elements to the second pixel electrode.

15. The display device of claim 13, wherein each of the light emitting elements comprises:
    a first conductive semiconductor layer doped with a first conductive dopant;
    a second conductive semiconductor layer doped with a second conductive dopant; and
    an active layer between the first conductive semiconductor layer and the second conductive semiconductor layer.

16. A display device comprising:
    a substrate comprising a display area having a plurality of pixel areas and a non-display area located around the display area;
    a circuit element layer comprising a circuit element in each of the pixel areas and a reference voltage wiring traversing the display area and electrically coupled to the circuit element; and
    a display element layer comprising a first pixel electrode on the circuit element layer in each of the pixel areas, a second pixel electrode located opposite to the first pixel electrode, a plurality of light emitting elements between the first pixel electrode and the second pixel electrode, and a first wiring on the circuit element layer in the non-display area,
    wherein the first wiring is directly coupled to the reference voltage wiring in the non-display area.

17. The display device of claim 16, wherein the reference voltage wiring extends in a first direction, and the first wiring extends in a second direction intersecting the first direction.

18. The display device of claim 17, wherein the first wiring comprises:
    a body portion that extends in the first direction; and
    a protruding portion that protrudes from the body portion in the second direction intersecting the first direction,
    wherein the protruding portion does not overlap the reference voltage wiring.

* * * * *